US006605904B2

(12) United States Patent  
Jenekhe et al.

(10) Patent No.: US 6,605,904 B2  
(45) Date of Patent: Aug. 12, 2003

(54) TUNABLE MULTICOLOR ELECTROLUMINESCENT DEVICE

(75) Inventors: Samson A. Jenekhe, Seattle, WA (US); Xuejun Zhang, Redondo Beach, CA (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 09/774,901

(22) Filed: Jan. 31, 2001

(65) Prior Publication Data

US 2002/0097001 A1 Jul. 25, 2002

Related U.S. Application Data

(60) Provisional application No. 60/179,096, filed on Jan. 31, 2000.

(51) Int. Cl.[7] .................................................. H01J 63/04

(52) U.S. Cl. ..................................... 315/169.3; 313/506

(58) Field of Search .................... 315/169.3; 313/498, 313/506

(56) References Cited

U.S. PATENT DOCUMENTS 5,514,878 A * 5/1996 Holmes et al. ............. 257/103  
6,274,979 B1 * 8/2001 Celii et al. ................. 313/498

OTHER PUBLICATIONS

Jenekhe et al. "Efficient Photovoltaic Cells from Semiconducting Polymer Heterojunctions," *Applied Physics Letters* 77(17): 2635–2637 (2000).  
Yohannes et al., "Multiple Electrochemical Doping–Induced Insulator–to–Conductor Transitions Observed in the Conjugated Ladder Polymer Polybenzimidazobenzophenanthroline (BBL)," *J. Phys. Chem.* 104: 9430–9437 (2000).  
Zhang et al. "Electroluminescence of Multicomponent Conjugated Polymers. 1. Roles of Polyer/Polymer Interfaces in Emission Enhancement and Voltage–Tunable Multicolor Emission in Semiconducting Polymer/Polymer Heterojunctions," *Macromolecules* 33:2069–2082 (2000).  
Zhang et al., "Electroluminescence and Photophysical Properties of Polyquinolines," *Macromolecules* 32:7422–7429 (1999).  
Yang et al., Probing Structure—Property Relationships in Third–Order Nonlinear Optical Polymers: Third Harmonic Generation Spectroscopy and Theoretical Modeling of Systematically Derivatized Conjugated Aromatic Poyimines *Ind. Eng. Chem. Res.* 38:1759–1774 (1999).  
Shetty et al., "Ionic Complexes of Conjugated Oligoquinolines," *Mat. Res. Soc. Symp. Proc.* 488:563–568 (1998).  
Lin et al., "Investigation of Organic–Organic Interfaces by Time–Resolved Photocurrent, Electrochemical, and Photoemission Techniques," *Mat. Res. Soc. Symp. Proc.* 488:689–693 (1998).  
Zhang et al., "Light–Emitting Diodes with Voltage–Switchable Colors from Semiconducting Polymer/Polymer Heterojunctions," *Mat. Res. Soc. Symp. Proc.* 488:539–544 (1998).  
Zhang et al., "Efficient Light–Emitting Diodes from Blends of Conjugated Polymers," *SPIE* 3148–89–101 (1997).

(List continued on next page.)

*Primary Examiner*—David Hung Vu  
(74) *Attorney, Agent, or Firm*—Nixon Peabody LLP

(57) ABSTRACT

The present invention relates to an electroluminescent device including an anode and a cathode capable of being electrically connected to a power supply and a voltage regulator, and a multi-layered polymer structure, between the anode and cathode, including a first polymer layer which includes a hole transfer polymer contacting the anode and a second polymer layer which includes an n-type conjugated polymer contacting the cathode, wherein changes in the voltage of current passing through the electroluminescent device change the color of electroluminescent emissions from the multi-layered polymer structure.

30 Claims, 17 Drawing Sheets

OTHER PUBLICATIONS

Lin et al., "Bipolar Molecular Composites: A New Class of High Electron Mobility Organic Solids," *SPIE* 3144:53–58 (1997).

Jenekhe et al., "Electroluminescent Proton Transfer Polymers," *Polym. Prepr.* 38(1):347–348 (1997).

Jenekhe et al., "Finite Size Effects on Electroluminescence of Nanoscale Semiconducting Polymer Heterojunctions," *Chem. Mater.* 9:409–412 (1997).

Chen et al., "Bipolar Conducting Polymers: Blends of p–Type Polypyrrole and an n–Type Ladder Polymer," *Macromolecules* 30:1728–1730 (1997).

Tarkka et al., "Electrically Generated Intramolecular Proton Transfer: Electroluminescence and Stimulated Emission from Polymers," *J. Am. Chem. Soc.* 118:9438–9439 (1996).

Jenekhe et al., "Photoinduced Electron Transfer in Binary Blends of Conjugated Polymers," *Chem. Mater.* 8(10):2401–2404 (1996).

Boyd et al., "Enhancement of Nonlinear Optical Properties of Nanoscale Composite Materials," *Polym. Mater. Sci. Eng.* 73:214–215 (1995).

Jenekhe et al., "Efficient Electronic Energy Transfer in Polymer Nanocomposite Assemblies," *Polym. Mater. Sci. Eng.* 73:165–166 (1995).

Agrawal et al., "Electrochemical Properties and Electronic Structures of Conjugated Polyquinolines and Polyanthrazolines," *Chem. Mater.* 8:579–589 (1996).

Jenekhe "Excited–State Complexes of Conjugated Polymers," *Adv. Mater.* 7(3):309–311 (1995).

Jenekhe "Excited–State Complexes of Conjugated Polymers: Novel Photophysical Processes and Optoelectronic Materials," *Polym. Sci. Eng.* 72:461–462 (1995).

Yang et al., "Group Contribution to Molar Refraction and Refractive Index of Conjugated Polymers," *Chem. Mater.* 7:1276–1285 (1995).

Yang et al., "Electronic Energy Transfer in New Polymer Nanocomposite Assemblies," *Supramolecular Science* 1(2):91–101 (1994).

Fischer et al., "Enhanced Nonlinear Optical Response of Composite Materials," *Physical Review Letters* 74(10):1871–1874 (1995).

Yang et al., "Nonlinear Optical Properties of Complexes of π–Conjugated Polymers," *Polymers for Advanced Technologies* 5:161–170 (1994).

Jenekhe, "Self–assembly of Functional Mesostructures and Discrete Objects from Synthetic Polymers," *Abstracts of Papers of the American Chemical Society* 220:268 (2000).

Jenekhe, "Self–assembly of Functional Mesostructure and Discrete Objects from Synthetic Polymers," *Abstracts of Papers of the American Chemical Society* 220:268 (2000).

Zhang et al., "Electroluminescence of A Series of N–Type Conjugated Polyquinolines," *Abstracts of Papers of the American Chemical Society* 218:540 (1999).

Lin et al., "Transient Photocurrents Across Organic–Organic Interfaces," *Applied Physics Letters* 72(7):864–866 (1998).

Zhang et al., "Efficient Electroluminescence from a New η–type Conjugated Polyquinoline," *Acta Polymer* 49:52–55 (1998).

Antoniadis et al., "Photogeneration and Photoluminescence Studies in Bilayer Structures Containing Poly (ρ–Phenylene Vinylene) and Molecualry Doped Polymers," *Mol. Cryst. Liq. Cryst.* 256:381–390 (1994).

Jenekhe "Solid–State Luminescence of Conjugated Polymers: Towards Efficient Light–Emitting Devices," *Proceedings for 48$^{th}$ Annual Conference of the Society for Imaging Science and Technology* 392–393 (1995).

Lin et al., "Charge Injection Dynamics in Organic Multilayers," *SPIE* 3476:150–155 (1998).

Meeker et al., "Multicolor Emission and Tunable Electroluminescence from Blends of Conjugated Polymers" *Polym. Mater. Sci. Eng* 83:208–209 (2000).

Jenekhe et al., "Tunable Multicolor Electroluminescent Polymer Devices for Full Color Displays," *Polym. Prepr.* 40(2):1194–1195 (1999).

Jenekhe et al., "Exchanging Light and Changes in Electronic Polymers," *Annu. Tech. Conf.—Soc. Plast. Eng* 54(2):1323–1326 (1996).

Gero Decher "Molecular Multilayer Films: The Quest for Order, Orientation, and Optical Properties," *Photonic and Optoelectronic Polymers* 672:445–456 (1997).

\* cited by examiner

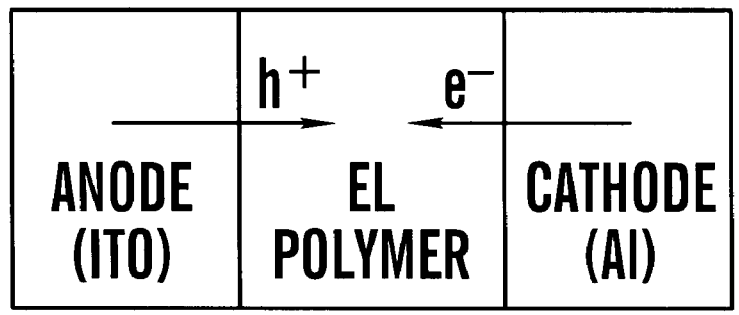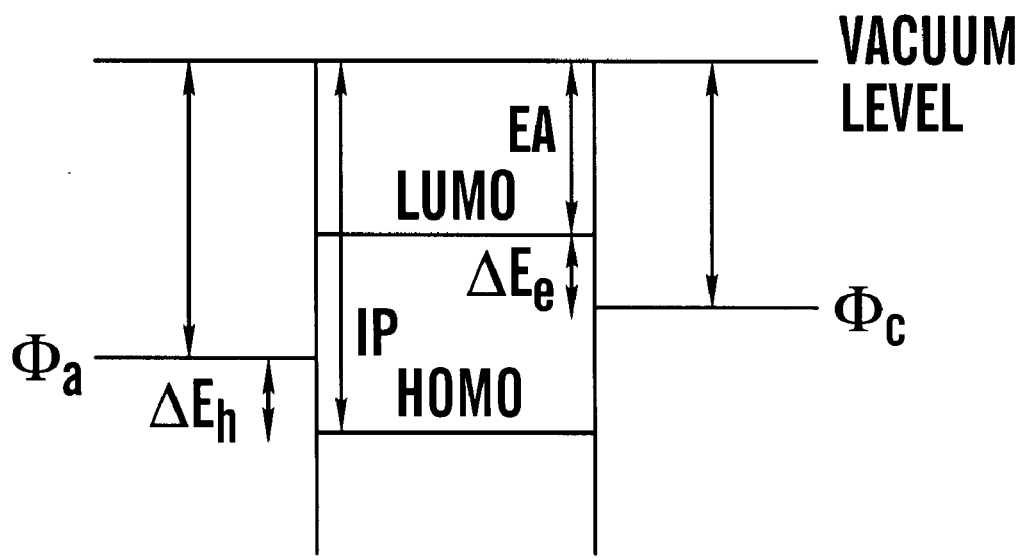
FIG. 1
*PRIOR ART*

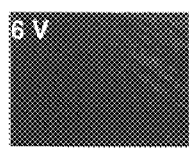  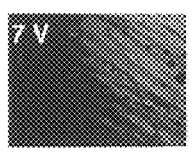 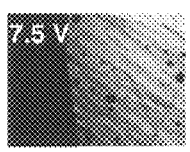 
*FIG. 13A*  *FIG. 13B*  *FIG. 13C*  *FIG. 13D*  *FIG. 13E*
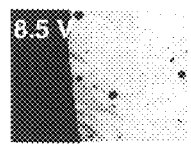 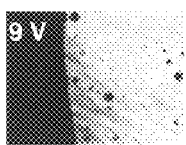 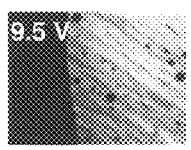 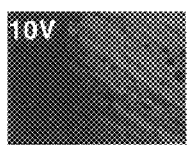 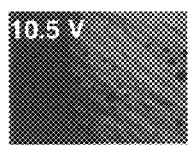
*FIG. 13F*  *FIG. 13G*  *FIG. 13H*  *FIG. 13I*  *FIG. 13J*
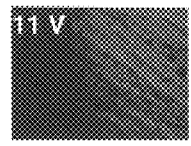 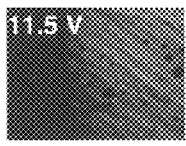 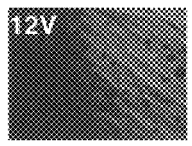 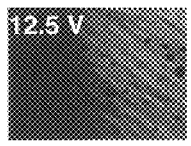 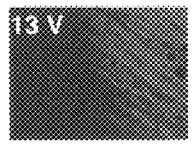
*FIG. 13K*  *FIG. 13L*  *FIG. 13M*  *FIG. 13N*  *FIG. 13O*

TUNABLE MULTICOLOR ELECTROLUMINESCENT DEVICE

This application claims the benefit of U.S. Provisional Patent Application Ser. No. 60/179,096, filed Jan. 31, 2000, which is hereby incorporated by reference in its entirety.

The present invention was made, at least in part, with funding received from the following government agencies: National Science Foundation, grant Nos. CHE-9120001 and CTS-9311741; Army Research Office MURI, grant No. DAAD19-99-1-0206; and Office of Naval Research, grant N00014-94-1-0540. The U.S. government may have certain rights in this invention.

FIELD OF THE INVENTION

The present invention relates to a multi-color electroluminescent device including multi-component conductive polymer layers capable of voltage-dependent, tunable multicolor electroluminescent emissions.

BACKGROUND OF THE INVENTION

Conjugated polymers in their native state are molecular semiconductors which are of growing interest in optoelectronic and electronic devices, including light-emitting diodes (LEDs) (Friend et al., 1999; Kraft et al., 1998; Tarkka et al., 1996; Eichen et al., 1998; Burn et al., 1993; Zhang et al., 1998(a)), lasers (Tessler et al., 1996; Hide et al., 1996; Wegmann et al., 1998), photovoltaic cells (Antoniadis et al., 1994(a); Halls et al., 1995), xerographic imaging photoreceptors (Zhang et al., 1996; Zhang et al., 1997(a); Osaheni et al., 1994(a); Osaheni et al., 1994(b); Abkowitz et al., 1992; Antoniadis et al., 1993), and thin film transistors (Garnier, 1998). In the case of polymer LEDs, synthetic manipulation of macromolecular architecture has made available diverse light-emitting conjugated polymers from which LEDs of various colors have been fabricated and are now being optimized by a variety of device engineering strategies. In efforts to design next generation electroluminescent (EL) materials with significantly improved EL efficiency and to explore novel phenomena, i.e., multicolor emission (Berggren et al., 1994; Jenekhe et al., 1997; Zhang et al., 1998(b); Hamaguchi et al., 1996; Wang et al., 1997), exciplex emission (Jenekhe et al., 1994; Osaheni et al., 1994(c); Gebler et al., 1997; Gebler et al., 1998), and photon harvesting/energy transfer (Yang et al., 1994; Lee et al., 1996; Tasch et al., 1997), not feasible in conjugated homopolymers, multicomponent conjugated polymer systems, which include multilayered thin films (Jenekhe et al., 1997; Zhang et al., 1998(b); Hamaguchi et al., 1996; Wang et al., 1997; Fou et al., 1996; Onitsuka et al., 1996; Strukelj et al., 1995; Li et al., 1997; Greenham et al., 1993; O'Brien et al., 1996; Yamamoto et al., 1996; Cui et al., 1999; Dailey et al., 1998), blends (Berggren et al., 1994; Yang et al., 1994; Lee et al., 1996; Tasch et al., 1997; Chen et al., 1997(a); Jenekhe et al., 1996; Yu et al., 1995; Zhang et al., 1997(b)), and block copolymers (Chen et al., 1996; Wagaman et al., 1997; Chen et al., 1997(b); Chen et al., 1997(c)), are of increasing interest.

In the simplest polymer LED, an EL polymer thin film, such as poly(p-phenylene vinylene) (PPV), is sandwiched between two electrodes of different work functions as schematically shown in FIG. 1a. Such a single-layer polymer LED is generally inefficient for two principal reasons. First, there is poor charge injection at one or both metal/polymer interfaces due to the inability to simultaneously match the anode work function ($\Phi_a$) to the highest occupied molecular orbital (HOMO) and the cathode work function ($\Phi_c$) to the lowest unoccupied molecular orbital (LUMO) of the polymer. The energy barriers to hole and electron injection at the anode and cathode are respectively $\Delta E_h$ (=$\Phi_a$-IP) and $\Delta E_e$ (=$\Phi_c$-EA) where IP is the ionization potential and EA is the electron affinity of the polymer (FIG. 1). Secondly, there is a huge disparity between hole and electron mobilities in semiconducting polymers (Antoniadis et al., 1994(b); Blom et al., 1996; Lin et al., 1996(a); Lin et al., 1996(b)), thus precluding balanced charge transport in the devices. Commonly studied EL polymers such as PPV (Friend et al., 1999), polyphenylenes (Leising et al., 1996; Leising et al., 1997), polyfluorenes (Grice et al., 1998; Pei et al., 1996; Lee et al., 1999), polythiophenes (Berggren et al., 1994) and their derivatives are p-type (hole transport) polymers which have hole mobilities that are orders of magnitude larger than electron mobilities, relatively small barriers to hole injection from indium-tin-oxide (ITO, $\Phi_a$~4.7–4.8 eV) (Kugler et al., 1997), and very large barriers to electron injection from air stable cathodes such as aluminum ($\Phi_c$~4.0–4.3 eV) (Weast et al., 1987–1988).

Two-layer polymer/polymer heterojunction LEDs have been found dramatically to improve EL efficiency and brightness (Jenekhe et al., 1997; Zhang et al., 1998(b); Strukelj et al., 1995; Li et al., 1997; Greenham et al., 1993; O'Brien et al., 1996; Yamamoto et al., 1996; Cui et al., 1999; Dailey et al., 1998), compared to the one-layer devices (FIG. 1). This is consistent with findings in multilayered organic/organic diodes (Tang et al., 1987).

n-Type (electron transport) polymers used in such two-layer heterojunction LEDs are thought to improve device efficiency through their high electron affinities which reduce the barrier to electron injection at the cathode/polymer interface (Greenham et al., 1993). An increasing part of current EL materials research effort is thus being directed to the design and synthesis of n-type polymers with improved properties (Strukelj et al., 1995; Li et al., 1997; Greenham et al., 1993; O'Brien et al., 1996; Yamamoto et al., 1996; Cui et al., 1999; Dailey et al., 1998). Both non-conjugated polymers, such as the oxadiazole-containing side-chain polymers (Strukelj et al., 1995; Li et al., 1997), and π-conjugated polymers such as polycyanoterephthalylidenes (CN-PPVs) (Greenham et al., 1993), polyphenylquinoxalines (O'Brien et al., 1996; Yamamoto et al., 1996; Cui et al., 1999), polypyridines (Dailey et al., 1998), and polyquinolines (Jenekhe et al., 1997) have been reported as electron transport layers in two-layer heterojunction LEDs. What is currently lacking, however, is understanding of the roles of the electronic structures and sizes of the polymer/polymer interfaces in such two-layer heterojunction LEDs. In contrast, extensive studies of metal/polymer interfaces (Salaneck et al., 1996; Kugler et al., 1999; Gao, 1999) in LEDs have provided knowledge of their general features and properties in relation to device performance. For example, the indium-tin-oxide (ITO)/PPV interface is believed to be quasi-ohmic, if not ohmic, for hole injection (Antoniadis et al., 1994(c)), whereas the cathode (Al, Ca, Mg)/PPV interface injects electrons by tunneling and/or other complex processes (Parker et al., 1994). Al/PPV interface is known to exhibit Schottky barrier characteristics, leading to photovoltaic properties (Antoniadis et al., 1994(a)).

In addition to their possible important roles in the two-layer heterojunction LEDs, polymer/polymer interfaces can also play a critical role in even single-layer LEDs if the polymer layer consists of a phase separated blend (Berggren et al., 1994) or a microphase separated block copolymer. More generally, polymer/polymer interfaces mediate a variety of photophysical and charge transfer processes in multicomponent conjugated polymer systems exemplified by efficient energy transfer in binary nanophase separated blends (Yang et al., 1994; Lee et al., 1996; Tasch et al., 1997) and block copolymers (Chen et al., 1996), exciplex formation (Jenekhe et al., 1994; Osaheni et al., 1994(c); Gebler et al., 1997; Gebler et al., 1998) in bilayers and blends, ground-state electron transfer in binary blends (Chen et al., 1997(a)), photoinduced electron transfer in binary blends (Jenekhe et al., 1996), and tunable multicolor electroluminescence in bilayers (Jenekhe et al., 1997; Zhang et al., 1998(b); Hamaguchi et al., 1996; Wang et al., 1997) and blends (Berggren et al., 1994). The coupling of finite size effects to the electronic structure and properties of polymer/polymer interfaces in such multicomponent polymers has been suggested from observed multicolor EL emission from two-layer heterojunctions (Jenekhe et al., 1997). Conjugated polymer bilayer heterojunctions have also been extensively studied as rectifying junctions (charge trapping electrodes, charge storage) in electrochemical experiments (Torres et al., 1990; Hillman et al., 1990).

The prior art has failed to define criteria for structural assembly and selection of compatible polymers for multicolor electroluminescent devices. The present invention overcomes these deficiencies in the art.

SUMMARY OF THE INVENTION

The present invention relates to an electroluminescent device including an anode and a cathode capable of being electrically connected to a power supply and a voltage regulator; and a multi-layered polymer structure, between the anode and cathode, including a first polymer layer which includes a hole transfer polymer contacting the anode and a second polymer layer which includes an n-type conjugated polymer contacting the cathode, wherein changes in the voltage of current passing through the electroluminescent device change the color of electroluminescent emissions from the multi-layered polymer structure.

Another aspect of the present invention relates to a full color display including a plurality of pixels, each pixel including an electroluminescent device of the present invention.

Yet another aspect of the present invention relates to a method of making a multi-color electroluminescent device, the method including the step of forming, between first and second electrodes, a multi-layered polymer structure including a first polymer layer which includes a hole transfer polymer and a second polymer layer which includes an n-type conjugated polymer.

The present invention identifies the role played by the electronic structure of a polymer/polymer interface and its affect on the EL diode efficiency and luminance. Finite size effects on the polymer/polymer bilayer heterojunctions were also explored. The substantially planar heterojunction is an ideal model system for investigating the electronic structure and properties of polymer/polymer interfaces; well-defined planar heterojunctions of diverse conjugated polymers and layer thicknesses can be prepared by a number of polymer processing techniques. The layer thicknesses of p-type polymer and the n-type polymer in a bilayer heterojunction were varied to probe size effects and multicolor EL emission. In addition to spectroscopic and electrical measurements we also used electroluminescence microscopy to characterize the heterojunction LEDs. The systematic investigation of the electroluminescence of bilayer heterojunctions of hole transfer polymers (p-type layer) and a series of n-type conjugated polymers, with electron affinities in the 2.36–4.0 eV range and ionization potentials in the 5.06–5.90 eV range, has shown that the electronic structure of the polymer/polymer interface plays a more important role on EL efficiency and diode brightness than injection barrier at the cathode/polymer interface. For a p-type emissive layer, such as PPV, the present invention demonstrates that both efficiency and diode brightness are maximized when the energetics of the bilayer heterojunction interface favors electron transfer while disfavoring hole transfer. A similar requirement of favorable hole transfer and unfavorable electron transfer across the interface of a bilayer LED with an n-type emitter also follows. Therefore, although synthesis of n-type (electron transport) polymers with large electron affinities is of broad interest per se, for applications in LEDs the absolute LUMO/EA and HOMO/IP energy levels of the n-type polymer are not the most critical, but these energy levels relative to those of the p-type (hole transport) polymer in a heterojunction are.

Continuous voltage-tunable multicolor emission was observed in bilayer heterojunction LEDs containing emissive p-type and n-type layers with sizes in the range of 20–50 nm. However, bilayer heterojunction LEDs of similar composition but having thicker layers had conventional single-color emission. These results show that the electronic and optical properties of polymer/polymer heterojunctions critically depend on the relative sizes of the bilayer components. These finite size effects originate from the small charge carrier ranges in semiconducting polymers. These observations on the roles of polymer/polymer interfaces and on the associated finite size effects on the electroluminescence of bilayer heterojunctions are expected to be applicable to other multicomponent conjugated polymer systems.

BRIEF DESCRIPTION OF THE DRAWINGS

FIG. 1 illustrates the construction of a prior art single-layer polymer LED and its associated energy levels.

FIG. 2A illustrates the construction of a two-layer heterojunction LED and its associated energy levels. FIG. 2B illustrates the construction of a three-layer heterojunction LED and its associated energy levels.

FIG. 4B is an enlargement of the region shown in FIG. 4A.

FIGS. 13A–O are images of EL micrographs (×30) of the ITO/PPV(35 nm)/PPQ(35 nm)/Al diode at various bias voltages showing continuous voltage tunability of EL emission color.

DETAILED DESCRIPTION OF THE INVENTION

One aspect of the present invention relates to an electroluminescent device which is capable of emitting multicolor light in response to the voltage of electrical current passing therethrough. The device includes an anode and a cathode capable of being electrically connected to a power supply and a voltage regulator, and a multi-layered polymer structure located between the anode and cathode. The multi-layered polymer structure includes a first polymer layer which includes a hole transfer polymer contacting the anode and a second polymer layer which includes an n-type conjugated polymer contacting the cathode. The multicolor emission of the multi-layered polymer structure are tunable; that is, changes in the voltage of current passing through the electroluminescent device result in a change to the color of electroluminescent emissions from the multi-layered polymer structure.

Figure 2A:
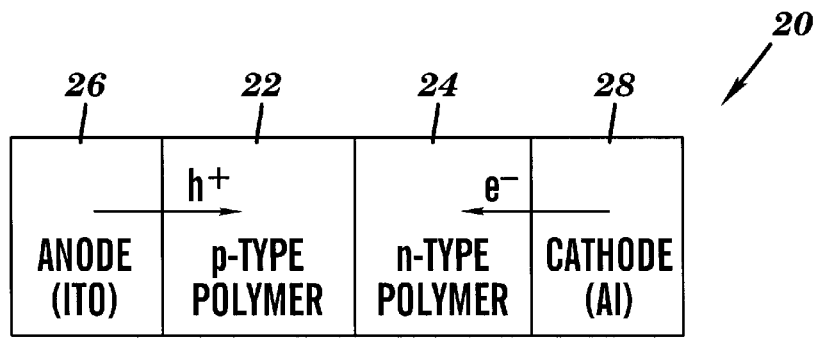
FIGS. 2A–B show two embodiments of multi-layered EL devices of the present invention.

As shown in FIG. 2A, one preferred embodiment of the electroluminescent device 20 is characterized by the first polymer layer 22 being proximate the anode 26 and the second polymer layer 24 being proximate the cathode 28, with a well-defined heterojunction between the first and second polymer layers.

Figure 3:
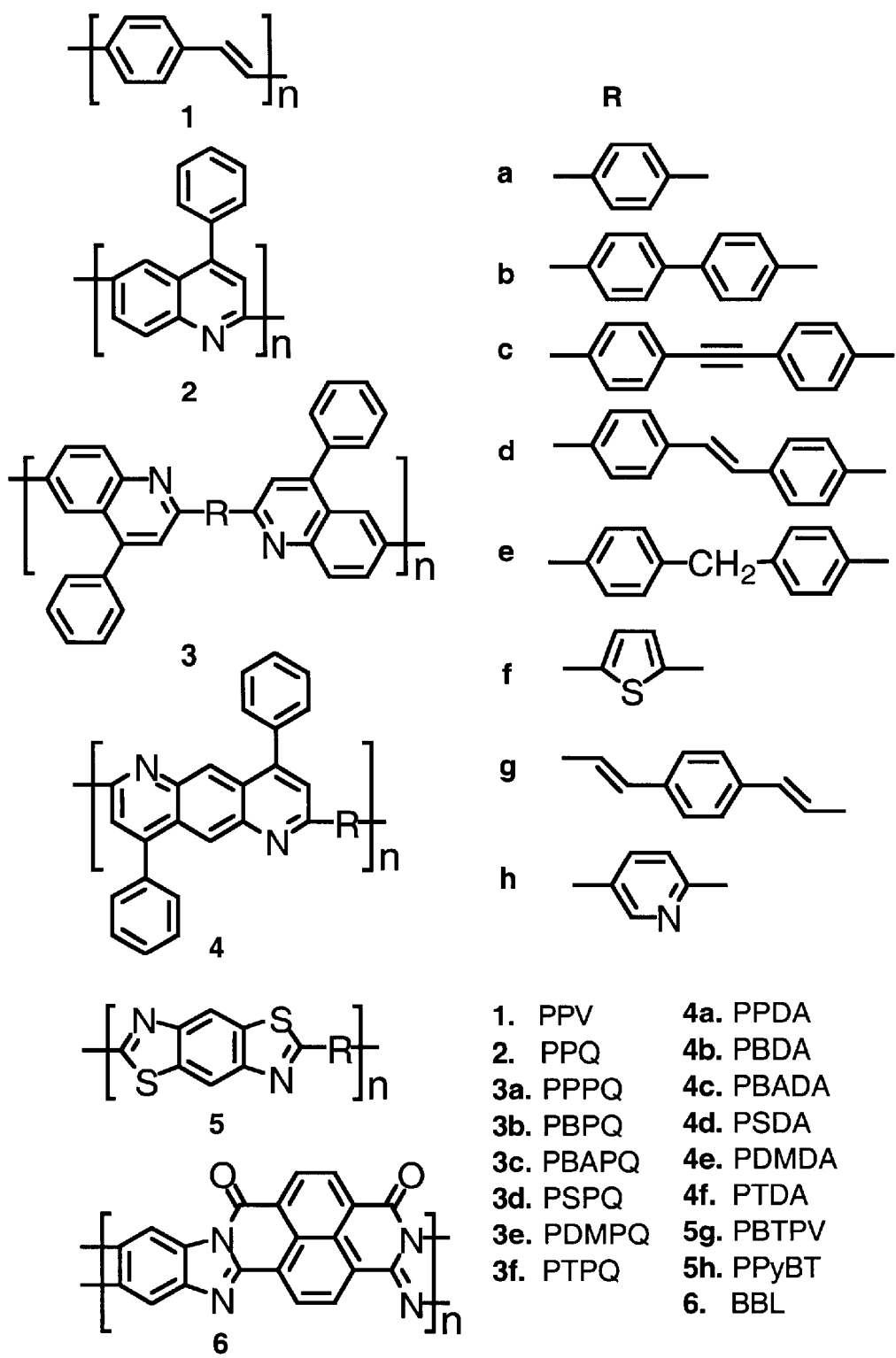
FIG. 3 illustrates the structure of a p-type conjugated polymer and a number of different n-type conjugated polymers.

The hole transfer polymer can be a doped polymer or a p-type conjugated polymer. Suitable p-type conjugated polymers include, without limitation, polyphenylenes, polyphenylene alkylenes, polyfluorenes, polythiophenes, poly (vinylcarbazole), or derivatives thereof. An exemplary p-type conjugated polymer is poly p-phenylene vinylene) (PPV) 1, whose structure is illustrated in FIG. 3. An exemplary doped polymer is 1,1-bis(di-4-tolylaminophenyl) cyclohexane (TAPC) doped polystyrene.

Suitable n-type conjugated polymers include, without limitation, polyquinolines 2, 3 (whose structures are illustrated in FIG. 3), polyanthazolines 4 (whose structures are illustrated in FIG. 3), polybenzobisthiazoles 5 (whose structures are illustrated in FIG. 3), polybenzimidazobenzophenanthroline ladders 6 (whose structures are illustrated in FIG. 3), polypyridines, polyphenylquinoxalines, polycyanoterephthalylidines, and derivatives thereof.

Exemplary polyquinolines include, without limitation, poly(2,6-(4-phenyl)quinoline) or PPQ 2; poly(2,2'-p-phenylene)-6,6'-bis(4-phenylquinoline)) or PPPQ 3a; poly (2,2'-(p,p'-biphenylene)-6,6'-bis(4-phenylquinoline)) or PBPQ 3b; poly(2,2'-(p,p'-biphenylacetylene)-6,6'-bis(4-phenylquinoline)) or PBAPQ 3c; poly(2,2'-(p,p'-stilbene)-6, 6'-bis(4-phenylquinoline)) or PSPQ 3d; poly(2,2'-(4,4'-diphenylmethylene)-6,6'-bis(4-phenylquinoline)) or PDMPQ 3e; and poly(2,2'-(2,5-thienylene)-6,6'-bis(4-phenylquinoline)) or PTPQ 3f; all of whose structures are illustrated in FIG. 3.

Exemplary polyanthazolines include, without limitation, poly(2,7-(1,4-phenylene)-4,9-diphenyl-1,6-anthrazoline) or PPDA 4a; poly(2,7-(p,p'-biphenylene)-4,9-diphenyl-1,6-anthrazoline) or PBDA 4b; poly(2,7-(p,p'-biphenylacetylene)-4,9-diphenyl-1,6-anthrazoline) or PBADA 4c; poly(2,7-(p,p'-diphenylethylene)-4,9-diphenyl-1,6-anthrazoline) or PSDA 4d; poly(2,7-(4,4'-diphenylmethylene)-4,9-diphenyl-1,6-anthrazoline) or PDMDA 4e; and poly(2,7-(1,5-thienylene)-4,9-diphenyl-1, 6-anthrazoline) or PTDA 4f, all of whose structures are illustrated in FIG. 3.

Exemplary polybenzobisthiazoles include, without limitation, poly(1,4-phenylenebisvinylene benzobisthiazole) or PBTPV 5g and poly(2,5-pyridylene benzobisthiazole) or PPyBT 5h, whose structures are illustrated in FIG. 3.

The anode and cathode can be formed of any suitable electrically conductive material including, without limitation, metals, metal alloys, metal amalgams, doped glasses and glass ceramics, and doped polymers. An exemplary anode material is indium-tin-oxide (ITO). Exemplary cathode materials include, without limitation, aluminum, calcium, magnesium, or combinations thereof.

Figure 4A:
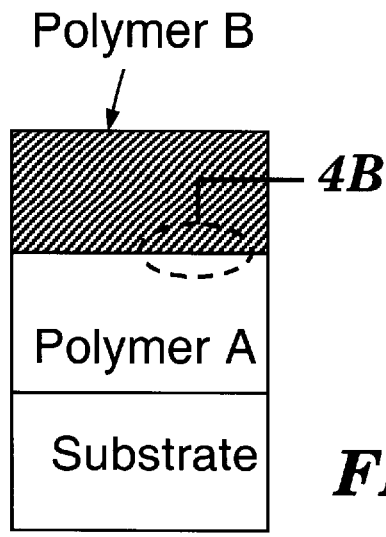
FIGS. 4A–B illustrate a model of the interface between sequentially spin coated amorphous thin films of two conjugated polymers A and B which are assumed to be rod-like chains.
Figure 4B:
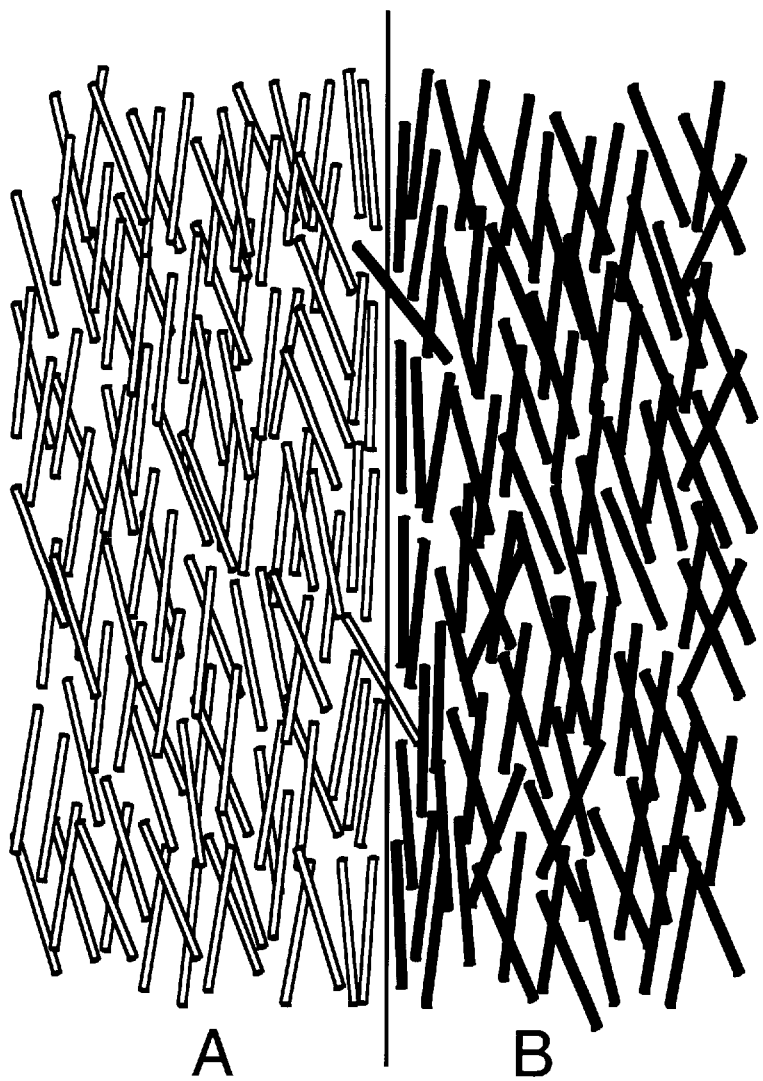

The thickness of the first and second polymer layers will, at least in part, determine whether the device is capable of multicolor electroluminescent emissions. The first polymer layer should have a thickness which is less than or equal to the hole range and the second polymer layer should have a thickness which is less than or equal to the electron range. Thus, the first and second polymer layers can have a thickness which is less than about 60 nm thick, preferably between about 25 nm to about 50 nm thick. The heterojunction between the first and second polymer layers should be well defined (i.e., substantially planar) as illustrated in FIG. 4A–B.

The relative ionization potential (IP) of the polymers which are used will also affect whether the device is capable of multicolor electroluminescent emissions. Basically, individual hole transfer polymers (including p-type conjugated polymers) and individual n-type conjugated polymers should be selected such that the difference between the IP of the hole transfer polymer and IP of the n-type polymer is greater than 0 (IP(hole transfer polymer)−IP(n-type polymer)>0).

The relative electron affinities (EA) of the polymers which are used will also affect whether the device is capable of multicolor electroluminescent emissions. Basically, individual hole transfer polymers (including p-type conjugated polymers) and individual n-type conjugated polymers should be selected such that the difference between the EA of the hole transfer polymer and EA of the n-type polymer is less than 0 (EA(hole transfer polymer)−EA(n-type polymer)<0).

An electroluminescent device of the present invention may also include additional polymer layers. According to one embodiment, shown in FIG. 2B, the electroluminescent device 30 is characterized by the first polymer layer 32 being proximate the anode 36 and the second polymer layer 34 being proximate the cathode 38. Between the first and second polymer layers 32, 34 is a third polymer layer 33. The third polymer layer should have a thickness as described above with respect to the first and second polymer layers. The heterojunction between the first and third polymer layers and third and second polymer layers should be well defined (i.e., substantially planar).

The third polymer layer can be formed from a single polymer or a binary blend of a hole transfer polymer (e.g., p-type conjugated polymers) and a n-type conjugated polymer. When formed of a binary blend, the hole transfer polymer and n-type conjugated polymer can be the same as or different from the hole transfer polymer and n-type conjugated polymer used in the first and second layers, respectively. Alternatively, EL block copolymers can also be employed, a number of which are disclosed in U.S. patent application Ser. No. 09/544,698 to Jenekhe et al., which is hereby incorporated by reference in its entirety.

Regardless of whether a single polymer or binary blend is employed for the third polymer layer, the IP and EA of the third polymer layer should be compatible with the IP's and EA's of the first and second polymer layers. For example, assuming a binary blend is employed for the third polymer layer, then the individual hole transfer polymers and individual n-type conjugated polymers of the various layers should be selected such that (i) the difference between the IP of the hole transfer polymer and the IP of the binary blend is greater than 0 (IP(hole transfer polymer)−IP(binary blend) >0) and (ii) the difference between the IP of the binary blend and IP of the n-type polymer is greater than 0 (IP(binary blend)−IP(n-type polymer)>0). Likewise, assuming a binary blend is employed for the third polymer layer, then the individual hole transfer polymers and individual n-type conjugated polymers of the various layers should be selected such that (i) the difference between the EA of the hole transfer polymer and EA of the binary blend is less than 0 (EA(hole transfer polymer)−EA(binary blend)>0) and (ii) the difference between the EA of the binary blend and the EA of the n-type polymer is less than 0 (EA(binary blend)−EA(n-type polymer)>0).

Yet another aspect of the present invention relates to a method of making a multi-color electroluminescent device by forming, between first and second electrodes, a multilayered polymer structure including a first polymer layer which includes a hole transfer polymer and a second polymer layer which includes an n-type conjugated polymer. Specifically, this process is carried out by coating a first electrode with a first polymer layer, coating the first polymer layer with a second polymer layer, and then placing a second electrode onto the second polymer layer. Additional coatings can, of course, be introduced between the polymer layers.

One approach for coating the various polymer layers onto the device is a conventional spin-coating process which is known in the art. For example, where a p-type conjugated polymer is used for the first polymer layer, the first polymer layer is formed by applying to the first electrode a solution or suspension including a p-type conjugated polymer and then spinning the first electrode under conditions sufficient to coat the first electrode with the p-type conjugated polymer, thereby forming the first polymer layer which has a substantially uniform thickness. Similarly, additional polymer coatings can be applied over the first polymer layer (i.e., second polymer layer, third polymer layer, etc.). A solution or suspension including the n-type conjugated polymer (or, e.g., a binary blend of p- and n-type conjugated polymers) is applied to the first polymer layer on the previously coated electrode, and then the coated electrode is subjected to spinning under conditions effective to coat the first polymer layer with the n-type conjugated polymer (or binary blend) to form the second (or third) layer which has a substantially uniform thickness. The process can be repeated for successive layers until the multilayered conjugated polymer structure is completed.

As one of skill in the art readily would appreciate, during spin coating the viscosity of the solution or suspension (thus, the concentration of the conjugated polymer therein) and the rotational velocity of the substrate will affect the thickness of the polymer layer produced by the process. To achieve a polymer layer thickness as described above, the polymer concentration and rotation velocity can be modified as necessary with little, if any, experimentation. Typically, the concentration of the p-type or n-type conjugated polymers can be about 0.1 to about 1 weight percent and the rotational velocity is between about 1,000 to about 3,000 rpm. For doped polymers, the concentration will vary according to the nature of dopants employed.

Once the multilayered polymer structure is fabricated, a second electrode is placed on the opposite side of the multilayered polymer structure such that any current passing between the first and second electrodes will pass through the multilayered polymer structure. The second electrode can be deposited onto the polymer structure using any of a variety of deposition techniques known in the art. For example, vacuum evaporation of a suitable material (e.g., aluminum, calcium, magnesium, etc.) can be carried out under conditions effective to produce an electrode of desired thickness. Aluminum vacuum evaporation can be carried out at less than about $5 \times 10^{-6}$ torr for sufficient time to achieve the desired thickness of about 100 nm to about 130 nm.

Figure 2B:
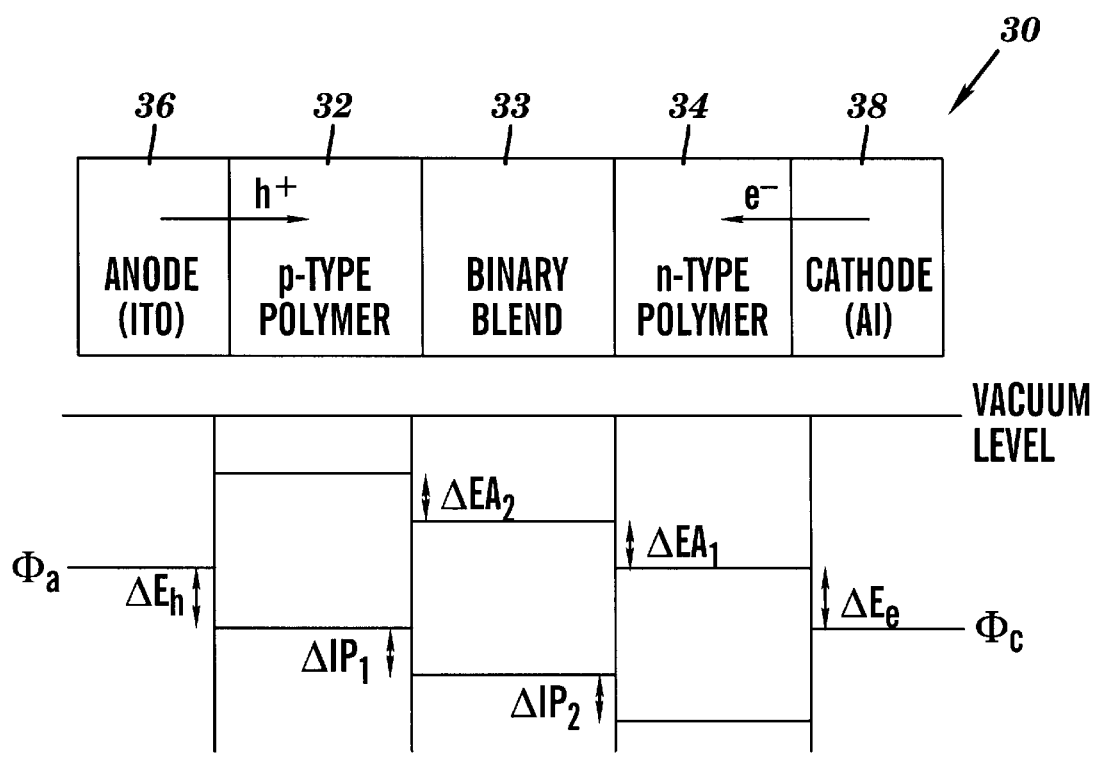
Figure 5:
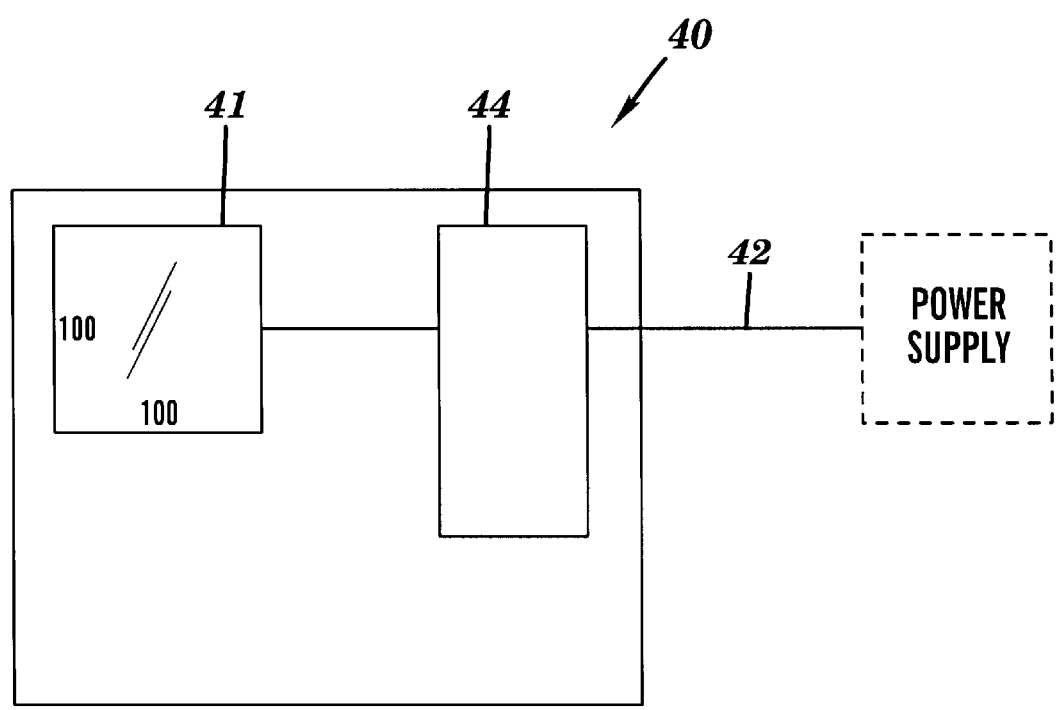
FIG. 5 illustrates a tunable, full color display which includes the EL devices of the present invention.

As illustrated in FIG. 5, a further aspect of the present invention is a full color display 40 which contains a display screen 41 including a plurality of pixels, e.g., a screen including 100×100 pixels. Each pixel of the display screen 41 includes an electroluminescent device of the present invention, e.g., as illustrated in FIG. 2A or 2B. The display 40 also includes an electrical connector 42, such as a grounded plug, for connection of the display to a power supply. A digital or analog control system 44 in the display modulates the voltage of electrical current delivered to each pixel, thereby determining the color of the pixel by regulating the voltage of electrical current passing through the multipolymer structure of the electroluminescent device. Thus, a desired color can be achieved for each pixel in the display. Because of the continuously variable voltage supply which can be delivered to each pixel, the color of electroluminescent emission is also continuously variable within a particular spectrum of visible light. The particular color spectrum available depends on the types of polymers employed in the multilayered polymer structure of the electroluminescent device.

EXAMPLES

The following examples are provided to illustrate embodiments of the present invention, but they are by no means intended to limit its scope.

The following materials and methods were utilized in preparing and analyzing the electroluminescent devices of the present invention.

Polymer Synthesis

The molecular structures of PPV and all the n-type semiconducting polymers are shown in FIG. 3.

The sulfonium precursor of PPV (1) in ~1 wt % methanol solution was purchased from Lark Enterprises (Webster, Mass.). Polyquinolines 2, 3a–3f (Agrawal et al., 1996; Agrawal et al., 1993(a)), polyanthrazolines 4a–4f (Agrawal et al., 1996; Agrawal et al., 1993(a); Agrawal et al., 1991), polybenzobisthiazoles 5g, 5h (Alanko, 1995; Osaheni et al., 1992(a); Osaheni et al., 1993), and BBL 6 (Osaheni et al., 1992(a)) were synthesized as previously reported (Agrawal et al., 1996; Alanko, 1995; Osaheni et al., 1992(a); Osaheni et al., 1995(a); Agrawal et al., 1993(a); Agrawal et al., 1991; Osaheni et al., 1993; Agrawal et al., 1993(b)).

Characterization of Polymer Heterojunction LEDs

Electroluminescence (EL) spectra were obtained by using a Spex Fluorolog-2 spectrofluorimeter. Current-voltage characteristics of LEDs were measured by using an HP4155A semiconductor parameter analyzer (Yokogawa-Hewlett Packard, Tokyo). The luminance (brightness) was measured by using a Grasby S370 optometer (Grasby Optronics, Orlando) equipped with a calibrated luminance sensor head (Model 211). The Model 211 sensor head can accurately measure the luminance of LEDs of spot size as small as 0.8 mm diameter when assembled together with a Model 1220 reflex viewing module with 5× microscope objective lens. The current-voltage and luminance-voltage curves were recorded simultaneously by hooking up the semiconductor parameter analyzer together with the optometer.

The quantum efficiencies of the diodes were measured by using procedures similar to that previously reported (Greenham et al., 1994). Photons emitted from LEDs were detected with a calibrated Grasby 221 photodiode (350–1100 nm, built into a Grasby 2550 integrating sphere). Quantum efficiencies reported in this paper refer to internal efficiencies assuming a refractive index of 1.6 for the semiconducting polymers used to fabricate EL devices (Agrawal et al., 1992; Gymer et al., 1993). Additional detailed procedures of measuring EL efficiencies of polymer LEDs have been reported elsewhere (Zhang et al., 1999). Electroluminescence microscopy of the heterojunction LEDs was done by using an Olympus model BX60 fluorescence/optical microscope (Olympus America, Melville, N.Y.) with an attached digital camera which imaged the true colors of light emitted from the LEDs. The electric field-modulated photoluminescence (PL) spectroscopy on EL devices was performed the same way as normal PL measurement (Osaheni et al., 1995(b)) except that an electric field was applied to the EL device. The detailed procedure of the electric field-modulated PL spectroscopy was given elsewhere (Zhang et al., 1997(b); Chen et al., 1997(b)). All the device fabrication and measurements were performed under ambient laboratory conditions.

Characterization of Photophysical Properties of Bilayer Polymer Heterojunction Thin Films A total of 16 conjugated polymers, which are known to exhibit reversible electrochemical reduction (Agrawal et al., 1996; Alanko, 1995; Osaheni et al., 1992(a); Osaheni et al., 1995(a)) and other n-type (electron transport) characteristics (Zhang et al., 1996; Zhang et al., 1997(a); Osaheni et al., 1994(a); Osaheni et al., 1994(b); Abkowitz et al., 1992; Antoniadis et al., 1993; Tunney et al., 1987; Wnek et al., 1985; Osaheni et al., 1992(b); Long et al., 1996), provided a range of electron affinities and ionization potentials that allowed the electronic structure of PPV/n-type polymer interface to be varied and probed. These n-type semiconducting polymers whose molecular structures are shown in FIG. 3 include seven polyquinolines (PQs), six polyanthrazolines (PATs), two polybenzobisthiazoles (PBTs), and one poly(benzimidazobenzophenanthroline ladder) (BBL). PPV on ITO was used as the model p-type EL polymer.

Representative bilayer polymer/polymer heterojunction thin films such as PPQ/PPV, PPPQ/PPV, PBTPV/PPV, and BBL/PPV were also probed by the optical absorption spectroscopy, steady-state PL spectroscopy, and picosecond time-resolved PL decay dynamics in order to understand better any photophysical processes occurring at the polymer/polymer interfaces. For these measurements, the bilayer heterojunction thin films were prepared in the same way as for the LEDs except that the substrates were silica instead of ITO-coated glass. Typically, the PPV layer was 10–30 nm thick and the n-type layer was 15–30 nm thick.

Optical absorption spectra were obtained by using a Perkin-Elmer Lambda 9 spectrophotometer. PL spectra were obtained by using a Spex Fluorolog-2 spectrofluorimeter. The films for steady state PL studies were positioned such that the light emission was detected at 22.5° from the incident beam. PL spectra of single-layer thin films (such as PPV) were corrected for the optical density (OD) of the film at the excitation wavelength ($\lambda_{ex}$) by a factor of $(1-10^{-OD(\lambda^{ex}, PPV)})$, where OD($\lambda_{ex}$, PPV) is the optical density of PPV thin film at the excitation wavelength ($\lambda_{ex}$). PL intensities of PPV in the bilayers such as PPV/BBL were additionally corrected for the absorption of the excitation light ($\lambda_{ex}$) and the reabsorption of the emission light ($\lambda_{em}$) by the n-type layer (such as BBL) by factors of $10^{-OD(\lambda_{ex}, BBL)}$ and $10^{-OD(\lambda_{em}, BBL)}$, respectively, where OD($\lambda_{ex}$, BBL) and OD($\lambda_{em}$, BBL) are optical densities of the BBL layer at the excitation wavelength ($\lambda_{ex}$) and the emission wavelength ($\lambda_{em}$), respectively. Time-resolved photoluminescence decay measurements were performed by using the time-correlated single photon counting technique (Osaheni et al., 1994(a); Osaheni et al., 1995(b)). The excitation system consists of a cavity pumped dye laser (Coherent Model 703D) circulating rhodamine 6G, synchronously pumped by a mode-locked frequency doubled Nd:YAG laser (Quantronics Model 416). The dye laser pulses were typically 10 ps duration at a repetition rate of 38 MHz, and the samples were excited at 420 nm. The PL decay was detected around the PL emission peak of PPV (540 nm).

Electrochemical (Redox) Properties

Electrochemical (redox) properties of the recently synthesized polyquinolines (Bu-PQ, Bu-PPQ, BuM-PPQ, and BuN-PPQ) were investigated by cyclic voltammetry (CV). Platinum (Pt) wire electrodes were used as both counter and working electrodes and the Ag/Ag+ electrode was used as the reference. Polymers were coated onto the working electrode by dipping the Pt wire electrodes into viscous polymer solutions. CV measurements were done in an electrolyte solution of 0.1M tetrabutylammonium hexafluorophosphate ($Bu_4NPF_6$) in acetonitrile. The detailed experimental procedures were the same as previously reported (Agrawal et al., 1996).

Example 1

Fabrication of Polymer/Polymer Heterojunction LEDs

FIG. 2A shows the schematic structure of the semiconducting polymer heterojunction LEDs. In the heterojunction devices, indium tin oxide (ITO) was used as the anode, PPV (25–130 nm) was used as the p-type layer, the various n-type conjugated polymers (15–100 nm) shown in FIG. 3 were each used as an n-type layer, and aluminum (Al) was used as the cathode.

ITO-coated glass substrates (Donelly Corp., Holland, Mich.) were cleaned sequentially in ultrasonic bathes of detergent, isopropanol/deionized water (1:1 volume) mixture, toluene, deionized water, and acetone. PPV thin films (25–130 nm) were deposited onto the ITO coated glass substrates by spin coating of the sulfonium precursor from methanol solutions followed by thermal conversion in vacuum (220–250° C. for 1–2 hr). For PPV single-layer devices, the PPV film thickness was 70 nm. Thin films of polyquinolines (PQs) and polyanthrazoline (PATs) were spin coated from their formic acid solutions onto the vacuum dried (converted) PPV layer and then dried in vacuum at 60° C. for 12 hr to get rid of the solvent (formic acid). Thin films of polybenzobisthiazoles (PBTs) and BBL were spin coated onto the PPV layer from their reversibly soluble Lewis acid (GaCl$_3$) coordination complexes in nitromethane (Jenekhe et al., 1989; Jenekhe et al., 1990; Yang et al., 1991). All solutions were filtered with a 0.2 μm (pore size) Acrodisc® 13 CR PTFE syringe filter (Pall Corp., East Hills, N.Y.) before spin coating.

The film thicknesses were measured by an Alpha-step profilometer (Model 200, Tencor Northern, San Jose, Calif.) with an accuracy of ±1 nm and confirmed by an optical absorption coefficient technique. The film thickness was controlled by adjusting the spin coating speed (1,000–3,000 rpm) and polymer solution concentrations (0.1–1 wt %).

Finally, 100–130 nm aluminum electrodes were vacuum (<5×10$^{-6}$ torr) evaporated onto the resulting polymer bilayers. The area of each device was about 0.2 cm$^2$ (5 mm diameter) and there were 9 devices per substrate.

Example 2

Structure and Properties of Semiconducting Polymer/Polymer Interfaces

Very little is currently known about the supramolecular structure or local morphology, electronic structure, and electronic properties of the interfaces between conjugated polymer thin films. In contrast, there is an extensive literature on the chemical structure, composition, size and mechanical properties of the interfaces between conventional flexible-coil polymers such as polystyrene/polyisoprene and polystyrene/poly(methyl methacrylate) (Wool, 1995). Because of the extensive interdiffusion between such flexible-coil polymers at an interface, the size of the interface region can range from 5 to 100 nm (Wool, 1995). However, on the ground of their stiff rod-like conformations, it is believed that the interfaces between π-conjugated polymers, such as prepared by sequential spin coating in the present study, can be assumed to be relatively sharp as shown by the schematic illustration of FIGS. 4A–B. The lack of solubility or swelling of PPV in the solvents from which the n-type conjugated polymers were spin coated is an important factor in achieving the bilayer heterojunctions with sharp interfaces. The fact that rod-like polymers have much larger relaxation times or smaller diffusion constants, compared to flexible coil polymers, is an additional factor favoring relatively sharp interfaces (Wool, 1995). Because chains of a rod-like polymer at or near an interface can generally have only translational and rotational Brownian motions, they tend to be confined to their side of the interface (Wool, 1995). The macroscopic morphology planarity) of the conjugated polymer/conjugated polymer interfaces will, of course, depend on the roughness or smoothness of the first polymer (PPV) layer deposited. Highly planar interfaces can be expected because the spin coating of Newtonian or non-Newtonian polymer solutions do lead to quite planar surfaces of deposited polymer thin films regardless of any non-uniformity in the substrate (Jenekhe et al., 1984; Jenekhe, 1984). In spite of the expected sharpness of the PPV/n-type polymer interfaces, good adhesion between the sequentially deposited layers was observed. This is likely due to strong van der Waals and π-π interactions across the interface between the essentially rod-like π-conjugated polymers.

The energy level diagram shown in FIG. 2A in terms of the HOMO/IP and LUMO/EA of the two polymers in a bilayer heterojunction assumes flat bands which are commonly observed in organic/organic interfaces (Ishii et al., 1999). To characterize the electronic structure of the polymer/polymer heterojunctions, the HOMO/IP and LUMO/EA values established from the electrochemical redox properties of the pure polymer thin films were used. They were referenced against saturated calomel electrode (SCE) (Agrawal et al., 1996; Alanko, 1995; Osaheni et al., 1992(a); Osaheni et al., 1995(a); Eckhardt et al., 1989). Both the vacuum level and the SCE energy level relative to it can be difficult quantities to measure precisely in organic semiconductors and conjugated polymers (Ishii et al., 1999; Bredas et al., 1983; Jandke et al., 1998). An SCE energy level of 4.4 eV below vacuum (Bredas et al., 1983) was used as the reference for establishing the IP and EA values of these polymers (Chen et al., 1997(a); Agrawal et al., 1996; Alanko, 1995; Osaheni et al., 1992(a); Osaheni et al., 1995(a)) which are collected in Table 1 below. The series of n-type polymers have electron affinities in the range of 2.36 to 4.0 eV compared to 2.71 eV for PPV. Similarly, their ionization potentials in the range of 5.06 to 5.90 eV vary widely compared to PPV (5.11 eV). The electronic structure of the series of PPV/n-type polymer bilayer heterojunctions can thus be expected to vary widely and provide insights into the effects of such polymer/polymer interfaces on the performance of LEDs and other optoelectronic devices.

TABLE 1

Electronic Structure Parameters and Photophysical Properties of Conjugated Polymer Thin Films

| Polymer | EA, eV | IP, eV | $\lambda_{max}^{ABS}$, nm | $E_g^{opt}$, nm | $\lambda_{max}^{PL}$, nm |
|---|---|---|---|---|---|
| 1, PPV | 2.71 | 5.11 | 408 | 515 | 528, 559 |
| 2, PPQ | 2.62 | 5.35 | 414 | 468 | 578 |
| 3a, PPPQ | 2.50 | 5.47 | 400 | 446 | 574 |
| 3b, PBPQ | 2.42 | 5.49 | 405 | 441 | 571 |
| 3c, PBAPQ | 2.47 | 5.48 | 407 | 456 | 564 |
| 3d, PSPQ | 2.48 | 5.35 | 414 | 468 | 590 |
| 3e, PDMPQ | 2.36 | 5.44 | 380 | 412 | 542 |
| 3f, PTPQ | 2.56 | 5.27 | 471 | 498 | 622 |
| 4a, PPDA | 2.83 | 5.27 | 443 | 505 | 618 |
| 4b, PBDA | 2.86 | 5.34 | 415 | 485 | 600 |
| 4c, PBADA | 2.89 | 5.36 | 428 | 482 | 628 |
| 4d, PSDA | 2.81 | 5.27 | 451 | 504 | 644 |
| 4e, PDMDA | 2.85 | 5.43 | 405 | 460 | 590 |
| 4f, PTDA | 2.87 | 5.06 | 500 | 571 | 706 |
| 5g, PBTPV | 2.70 | 5.20 | 475, 508 | 590 | 630 |
| 5h, PPyBT | 2.76 | 5.60 | 440, 470 | 500 | 560 |
| 6, BBL | 4.00 | 5.90 | 568 | 680 | 720 |

Figure 6:
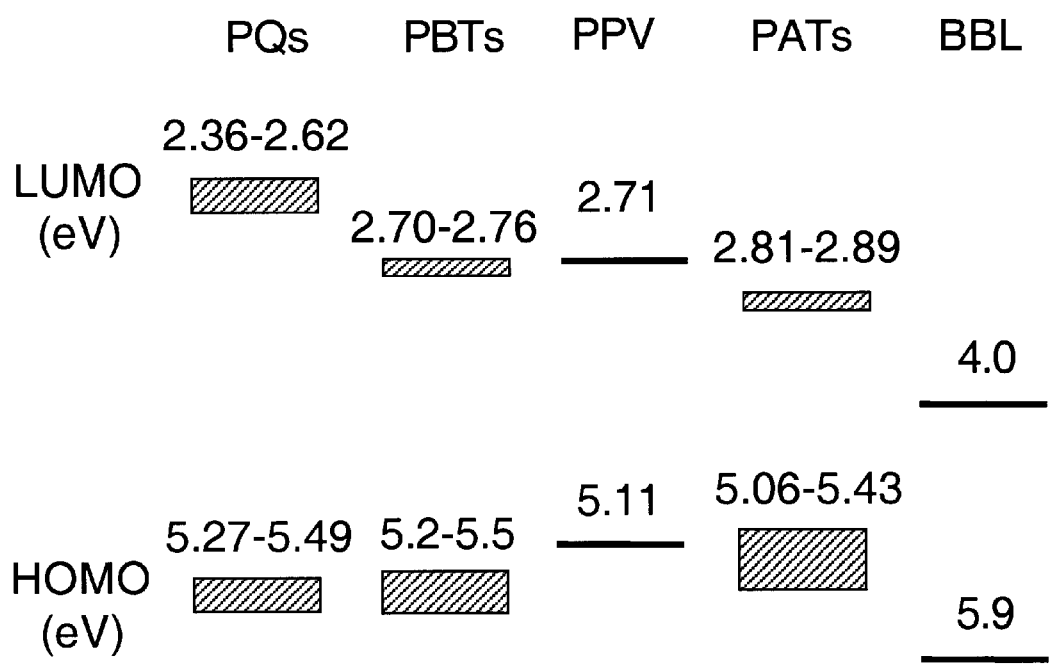
FIG. 6 illustrates the HOMO/IP and LUMO/EA levels of PPV and the n-type polymers shown in FIG. 3.

A schematic of the HOMO/IP and LUMO/EA levels of all the n-type semiconducting polymers and those of PPV is shown in FIG. 6. Based on these zero-field energy levels one sees that all the PPV/polyquinoline (PQ) and PPV/ polybenzobisthiazole (PBT) heterojunctions have interfacial energetics that favor electron transfer from the n-type polymer layer while there is barrier to hole transfer from the PPV layer. Bilayer heterojunctions of the PPV/polyanthrazoline (PAT) type have energetic barriers to both electron and hole transfer except in PPV/PTDA where hole transfer from PPV is feasible. The interface electronic structure of PPV/BBL shows very large barriers to both electron and hole transfer across the interface. For later use in quantitative comparison of the effects of the interface electronic structure on electroluminescence, these barriers to hole and electron transfer are defined as $\Delta IP=IP(\text{n-type polymer})-IP(PPV)$ and $\Delta EA=EA(\text{n-type polymer})-EA(PPV)$, respectively. In the presence of high electric fields additional considerations may enter into the picture of charge transfer across the polymer/polymer interface due to possible electric field-induced charge transfer processes.

The possible occurrence of photophysical processes at the polymer/polymer interfaces in these bilayer heterojunctions may also be anticipated from the HOMO/LUMO energy levels of FIG. 6. For example, exciton energy transfer seems feasible in the PPV/polyquinoline heterojunctions. However, except in one case (PPV/PBTPV) where there is some overlap between the absorption spectrum of PBTPV (5g) and the emission spectrum of PPV, the necessary absorption/emission overlap for efficient exciton energy transfer (Yang et al., 1994) was nonexistent in all the bilayer heterojunctions. Exciplex formation (Zhang et al., 1996; Zhang et al., 1997(a); Osaheni et al., 1994(a); Osaheni et al., 1994(b); Jenekhe et al., 1994; Osaheni et al., 1994(c); Gebler et al., 1997; Gebler et al., 1998) or photoinduced electron transfer (Jenekhe et al., 1996) may seem feasible particularly in PPV/BBL heterojunctions and perhaps also in PPV/polyanthrazoline bilayers. These possibilities were investigated in representative bilayer heterojunctions by steady state photoluminescence (PL) spectroscopy and in some cases also by PL decay dynamics. Optical absorption spectra of PPV/n-type polymer bilayer heterojunctions were simple superpositions of those of the component layers.

Figure 7:
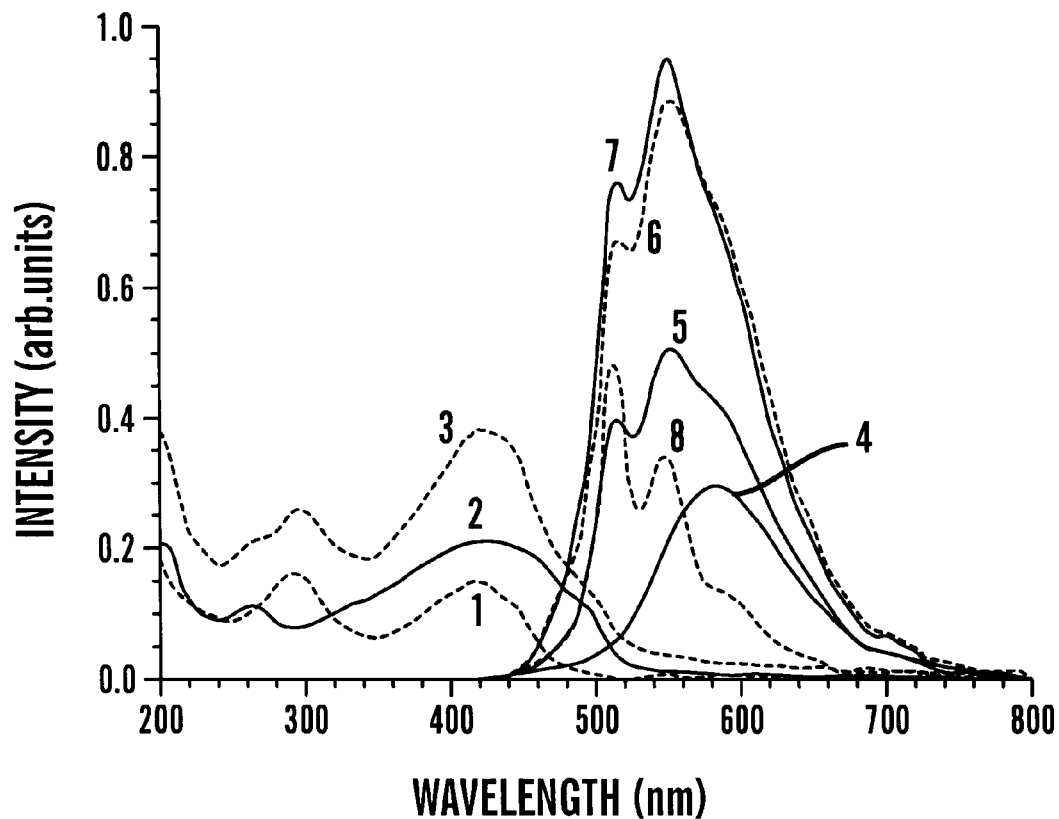
FIG. 7 is an optical absorption spectra of PPQ (1), PPV (2), and bilayer PPQ/PPV (3) thin films on silica substrates. PL spectra of PPQ (4, excited at 400 nm) and bilayer PPQ/PPV films (5–8, excited at 360, 400, 440, and 480 nm, respectively).

The PL emission spectra of a PPV/PPQ bilayer at different excitation wavelengths are shown in FIG. 7 along with the emission spectrum of a single-layer PPQ thin film. The PL spectra corresponding to 360–440 nm excitations of the bilayer were clear superpositions of those of the component layers. Interestingly, excitation of the PPV/PPQ bilayer from the PPQ side at 480 nm, where PPQ does not absorb, gave a PL emission spectrum identical in lineshape, emission maximum (510 nm) and intensity to that of a single-layer PPV thin film. Similar results were obtained in other bilayer heterojunctions. Even in the case of PPV/PBTPV where there is some evidence of exciton energy transfer from the PPV layer to the PBTPV layer, excitation wavelength-dependent PL emission spectra were obtained. For example, excitation of the PPV/PBTPV bilayer above the absorption edge of PPV (515 nm, Table 1) gave a PL emission band that was characteristic of the single-layer PBTPV ($\lambda_{max}$=630 nm). Excitation of the same bilayer at 400–480 nm gave PL emission bands with multipeaks due to both PPV and PBTPV. These results demonstrate that bilayer heterojunctions of fluorescent conjugated polymers exhibit excitation wavelength tunable emission spectra. No evidence of new emission bands that may indicate exciplex formation (Jenekhe et al., 1994; Osaheni et al., 1994(c); Gebler et al., 1997; Gebler et al., 1998) was found in any of the bilayer heterojunctions.

Although the emission band of PPV which covers the 460–620 nm spectral range completely overlaps the absorption spectrum of BBL which covers ~440–720 nm, no indication of exciton energy transfer was observed in the PPV/BBL bilayer heterojunction. This is consistent with the HOMO/LUMO energy levels of this pair of conjugated polymers (FIG. 6). Instead, a factor of 2.1–2.3 quenching of both the luminescence of PPV and BBL was observed when the heterojunction was excited at two different wavelengths (400 and 580 nm). Photoinduced electron transfer from PPV to BBL at the junction interface is consistent with the large luminescence quenching and interface electronic structure. The PL decay dynamics obtained by exciting a single-layer PPV and a PPV/BBL bilayer at the same excitation wavelength (420 nm) and monitored at the same wavelength (540 nm) showed that the excited state lifetime was substantially shortened in the bilayer. Whereas the single-layer PPV thin film had lifetimes of 130 and 500 ps, the PPV/BBL bilayer had lifetimes of 70 and 300 ps. These PL decay dynamics are also consistent with photoinduced electron transfer at the interface between PPV and BBL. Although the high electron affinity of BBL can be beneficial to electron injection in LEDs, efficient photoinduced electron transfer at the polymer/polymer interface and associated luminescence quenching suggest that the prospects for efficient LEDs from PPV/BBL heterojunctions are not good whereas photovoltaic cells may be more promising.

Example 3

Enhancement of Electroluminescence of Polymer/Polymer Heterojunctions

The turn-on voltage, luminance or brightness, electrical characteristics, and electroluminescence efficiency of the sixteen PPV/n-type polymer bilayer LEDs (ITO/PPV/n-type polymer/Al) were investigated in detail for comparison with the single-layer ITO/PPV/Al diode. In particular, we aimed to understand the role of the electronic structure of the polymer/polymer interface compared to other factors such as electron injection at the cathode (Al)/polymer interface.

Figure 8A:
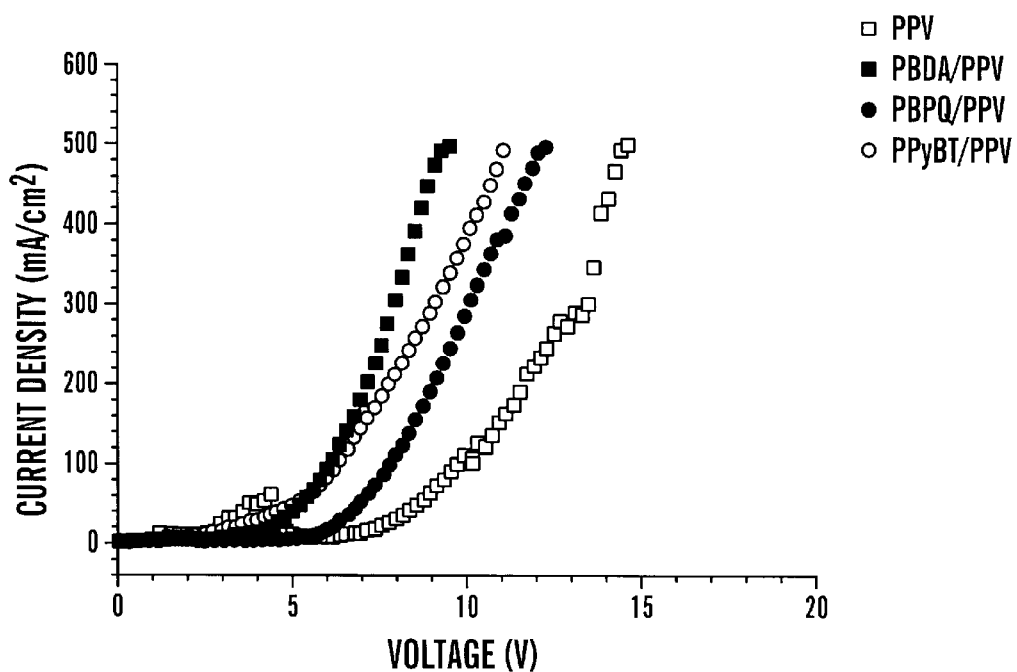
FIGS. 8A–B are graphs illustrating the current density-voltage (8A) and luminance-voltage (8B) characteristics of EL devices: ITO/PPV(70 nm)/Al; ITO/PPV(35 nm)/PBDA (20 nm)/Al; ITO/PPV(35 nm)/PBPQ(30 nm)/Al; and ITO/PPV(60 nm)/PPyBT(15 nm)/Al.
Figure 8B:
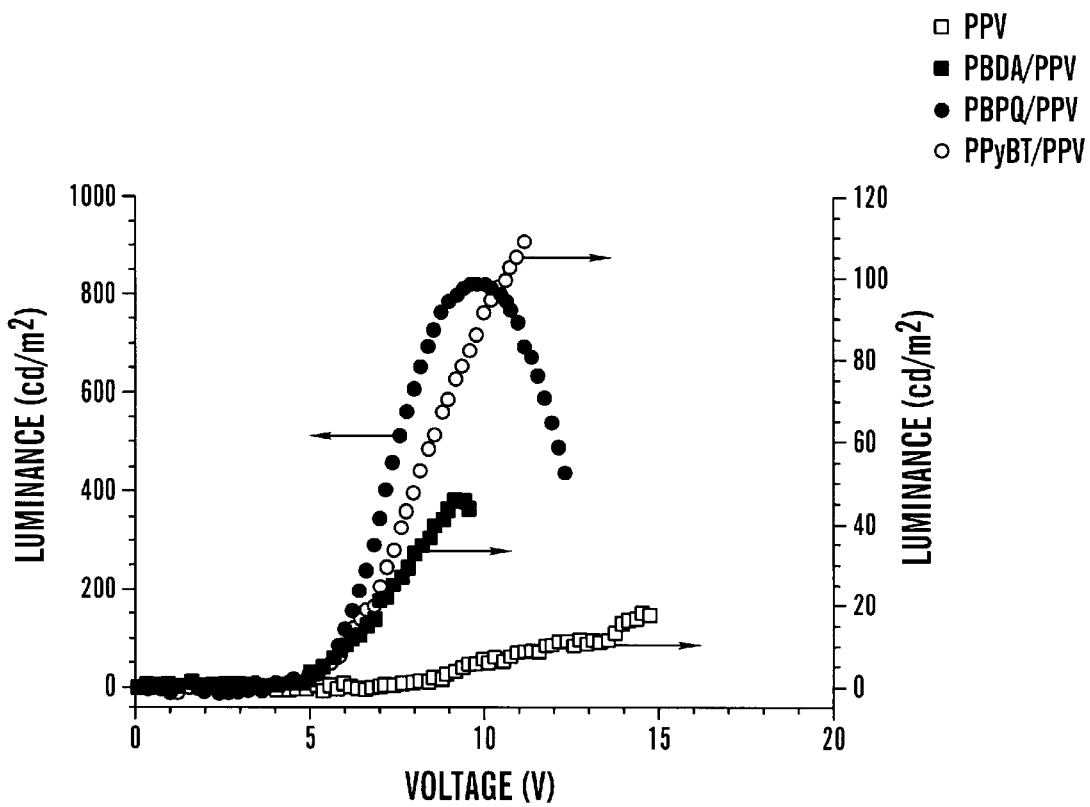

FIG. 8A shows the current-voltage (I-V) characteristics of three representative bilayer LEDs (PPV/PBDA, PPV/PBPQ, and PPV/PPyBT) and the single-layer PPV diode. The corresponding luminance-voltage (L-V) curves of these LEDs are shown in FIG. 8B. For the single-layer PPV EL device (ITO/PPV(70 nm)/Al), the turn-on voltage ($V_{on}$), defined as the onset of visible light emission, was 7 V ($1.0 \times 10^6$ V/cm). As seen in the I-V curve, the single-layer PPV diode had a current spike at 3–5 V below the turn-on voltage. This is similar to the space charge limited transient current in organic semiconductors with traps (Gutmann et al., 1967). It may be an indication of space charge accumulation at the Al/PPV interface, reflecting poor electron injection in the single-layer diode. Such an effect was not observed in the I-V characteristics of all the bilayer LEDs as exemplified by those in FIG. 8A. The turn-on voltage (electric field) for the three bilayer LEDs shown in FIG. 8 was between 3.5 V ($5.4 \times 10^5$ V/cm) for PPV/PBPQ and 5 V ($6.7 \times 10^5$ V/cm) for PPV/PPyBT. The turn-on voltage ($V_{on}$) for all the bilayer LEDs was less than that of the single-layer PPV diode, as indicated in Table 2 below. The reduced turn-on voltage (electric field) of the bilayer LEDs suggests improved electron injection and transport compared to the single-layer PPV diode.

TABLE 2

Performance of Bilayer Heterojunction LEDs

| Device | Thickness (nm) | $V_{on}$ (V) | $L_{max}$ (cd/m$^2$) | $V_{max}$ (V) | $I_{max}$ (mA/cm$^2$) | Efficiency (%) |
|---|---|---|---|---|---|---|
| PPV | 70 | 7 | 18 (10)* | 15 (12)* | 500 | 0.03 (0.04)* |
| PPQ/PPV | 35/35 | 4.5 | 330 (324) | 13 (12.5) | 250 | 1.05 (1.20) |
| PPPQ/PPV | 30/35 | 6 | 138 | 12 | 230 | 0.48 |
| PBPQ/PPV | 30/35 | 3.5 | 826 | 9.5 | 220 | 2.99 |
| PBAPQ/PPV | 35/35 | 5.5 | 154 (99) | 12 (10.5) | 410 | 0.30 (0.36) |
| PSPQ/PPV | 35/35 | 5.5 | 88 (54) | 14 (11.5) | 500 | 0.14 (0.20) |
| PDMPQ/PPV | 30/35 | 5.5 | 430 (350) | 16 (14) | 460 | 0.75 (1.41) |
| PTPQ/PPV | 40/35 | 3.5 | 52 (27) | 8 (6) | 500 | 0.08 (0.10) |
| PPDA/PPV | 20/35 | 5 | 46 (32) | 14 (11) | 460 | 0.08 (0.12) |
| PBDA/PPV | 20/35 | 4.5 | 46 (26) | 9.5 (7.5) | 500 | 0.07 (0.09) |
| PBADA/PPV | 20/35 | 4.5 | 47 (26) | 12 (7.5) | 490 | 0.08 (0.09) |
| PSDA/PPV | 25/35 | 5.5 | 26 (14) | 10 (8.5) | 450 | 0.05 (0.05) |
| PDMDA/PPV | 25/35 | 6.5 | 22 | 13 | 200 | 0.09 |
| PTDA/PPV | 25/35 | 6.5 | 19 (9) | 15 (12) | 500 | 0.03 (0.03) |
| PBTPV/PPV | 15/60 | 6 | 48 (24) | 12.5 (10) | 500 | 0.08 (0.09) |
| PPyBT/PPV | 15/60 | 5 | 110 (50) | 11.5 (8) | 500 | 0.18 (0.18) |
| BBL/PPV | 30/35 | | | No light at all | | |

*The values in parentheses correspond to the current density of 220 mA/cm$^2$.

The luminance or brightness of the bilayer LEDs was also substantially enhanced compared to the single-layer PPV diode, as exemplified in FIG. 8B. The maximum luminance ($L_{max}$) of the ITO/PPV/Al diode was 18 cd/m$^2$ at 15 V ($2.1 \times 10^6$ V/cm). The $L_{max}$ values for the PPV/PBDA and PPV/PPyBT bilayer LEDs at the same voltage were 47 and 110 cd/m$^2$, respectively. The brightest bilayer LED was the PPV/PBPQ heterojunction with an $L_{max}$ of 820 cd/m$^2$ (FIG. 8B, Table 2). Other very bright bilayer LEDs include PPV/PPQ and PPV/PDMPQ with $L_{max}$ of 330–430 cd/m$^2$ (Table 2).

The LED performance data, including the turn-on voltage ($V_{on}$), $L_{max}$ with corresponding operating voltage ($V_{max}$), current density ($I_{max}$), and EL efficiency are summarized in Table 2 for the sixteen bilayer heterojunctions and the single-layer PPV. To facilitate easy comparison the luminance, operating voltage, and EL efficiency corresponding to a current density of 220 mA/cm$^2$ are also given in Table 2. For example, at this current density the luminance of the single-layer PPV and the bilayers PPV/PDMPQ and PPV/PBPQ was 10, 350, and 826 cd/m$^2$, respectively, showing enhancements of 35–83 times. In general, the luminance of the bilayer heterojunctions varied substantially among the different classes of n-type conjugated polymers as shown in FIG. 6. Bilayers containing polyquinolines (PQs) were the brightest and most enhanced, followed by the polybenzobisthiazoles (PBTs), whereas the polyanthrazolines (PATs) resulted in the smallest enhancement relative to the reference single-layer PPV diode. Light emission was not obtained from the PPV/BBL diode.

The observed trends in the luminance data were also evident in the EL efficiency data (Table 2). The PPV/PBPQ and PPV/PDMPQ bilayer diodes had EL efficiencies of 3% and 1.4% photons/electron, respectively. Except for the PPV/PTPQ bilayer which was more efficient by a factor of 2.7, all the PPV/polyquinoline heterojunctions had EL efficiency enhancement of 5 to 100 times relative to the single-layer PPV diode. Bilayers of PPV/polybenzobisthiazoles and PPV/polyanthrazolines had EL efficiency enhancements of factors of 3–6 and 2–3, respectively. No light emission was observed from the PPV/BBL LED. As electron transport layers for PPV-based LEDs these results show that the polyquinolines as a class, and particularly the members PPQ, PDMPQ, and PBPQ, are the best and superior to prior reported materials such as the polyoxadiazoles (Li et al., 1997), poly(phenylquinoxalines) (O'Brien et al., 1996), and polypyridine (Dailey et al., 1998).

The significant enhancement of EL efficiency and LED brightness observed in these bilayer heterojunctions, particularly their variation with n-type polymer structures, are very difficult to understand in terms of improved electron injection and transport. Insertion of an n-type polymer or electron transport layer (ETL) between PPV and aluminum cathode is supposed to improve LED performance by reducing the barrier to electron injection at the cathode $\Delta E_c (= \Phi_c - EA)$ (FIG. 2A) through its higher electron affinity relative to PPV (Greenham et al., 1993). However, in the series of 16 n-type polymers examined here, those with the highest EA values had the worst bilayer LED performance relative to the PPV single-layer (Tables 1 and 2). For example, the ITO/PPV/BBL/Al diode has an essentially ohmic contact at the BBL/Al interface with an almost perfect match of EA (4.0 eV) to the work function of Al (~4.0–4.3 eV) (Weast et al., 1987–1988). Yet this bilayer had no light emission and hence was worse than the single-layer PPV diode. From these results, it is possible to conclude that because the bilayer LED performance does not improve with increasing electron affinity but instead decreases, the size of the electron injection barrier at the aluminum/n-type polymer interface is not an important factor in the observed variation of EL efficiency and luminance with bilayer heterojunction composition. A likely reason for this is that electron injection at the Al/n-type polymer interface is equally efficient, regardless of the specific polymer in the series, due to a reaction at the interface which mediates the injection process. Such metal/conjugated polymer interfacial reactions are known to always occur upon evaporative deposition of metal atoms onto a conjugated polymer (Salaneck et al., 1996; Kugler et al., 1999; Gao, 1999). In the case of the series of n-type polymers under investigation here (FIG. 3), their electron rich heteroatoms can be expected to make formation of an interface Al/polymer reaction product more facile. Such an interfacial aluminum/polymer complex would be expected to be similar in structure and function to an n-type doped polymer, facilitating efficient electron injection regardless of the electron affinity value of the polymer. Therefore, it is proposed that the electronic structure of the polymer/polymer interfaces rather than electron injection at the Al/polymer interface is the key to understanding the observed electroluminescence enhancement and trends in these bilayer heterojunctions as discussed below.

Example 4

Roles of Polymer/Polymer Interfaces in Heterojunction LEDs

Figure 9A:
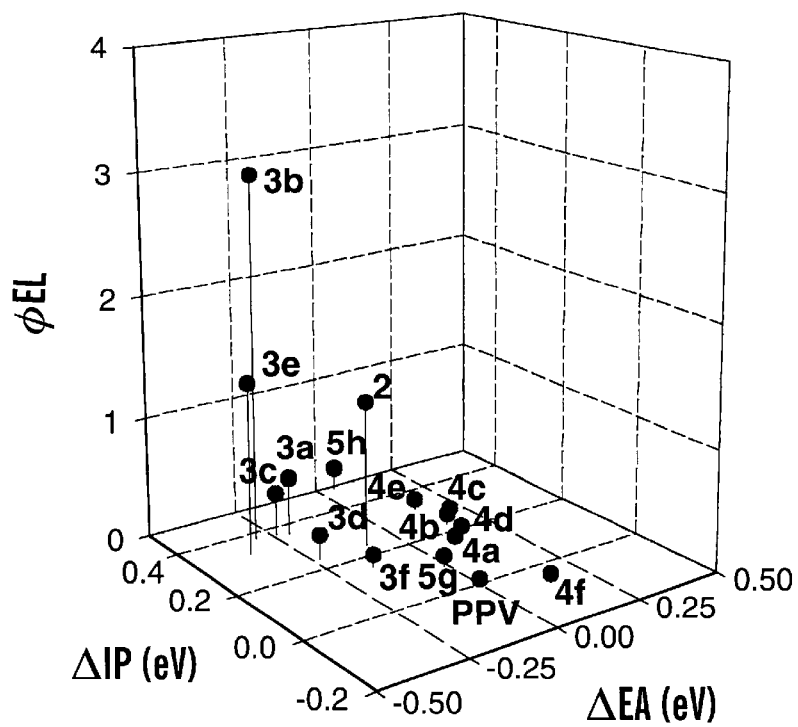
FIGS. 9A–B are three-dimensional plots of the EL efficiency ($\phi_{EL}$) (9A) and the maximum luminance ($L_{max}$) (9B) of the bilayer heterojunction LEDs and the PPV single-layer diode as a function of ΔEA and ΔIP.
Figure 9B:
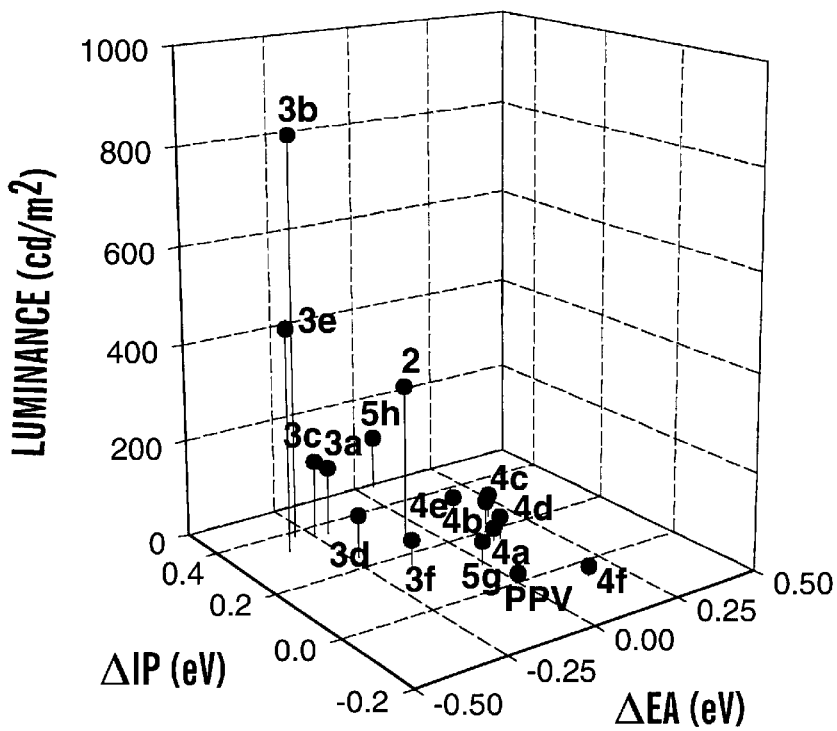

A critical examination of the above electroluminescence efficiency ($\phi_{EL}$) and luminance data suggests that they are strong functions of both ΔEA and ΔIP which characterize the electronic structure of the polymer/polymer interface (FIG. 2A). A 3-D plot of $\phi_{EL}$ or $L_{max}$ as a function of the variables ΔEA and ΔIP best quantifies these dependencies as shown in FIGS. 9A–B. A combination of energetic barrier to hole transfer (ΔIP>0) and favorable electron transfer (ΔEA<0) at the interface appears to be the necessary requirement for enhanced EL emission in the bilayer LEDs. On this basis all the observed trends of EL efficiency and diode luminance in the bilayer heterojunctions can be fully rationalized.

The interface energetics of PPV/polyquinoline heterojunctions is such that there is no barrier to electron transfer from the PQs to the PPV layer while there is about 0.16–0.38 eV barrier to hole transfer across the interface from the PPV layer. Provided that the alignment of the LUMO levels at the interface favors electron transfer (ΔEA<0) for a given bilayer, then the largest energy barrier to hole transfer gives the best EL performance as exemplified in PPV/PDMPQ and PPV/PBPQ which have ΔIP of 0.32–0.38 eV and the highest efficiencies and brightness among the polyquinolines. Although the polybenzobisthiazoles (PBTs) have 0.09–0.49 eV barrier to hole transfer from PPV, they also have small barriers to electron transfer (ΔEA =0.05 eV for PPyBT) which appears to account for the poorer performance of PPV/PBT LEDs compared to the polyquinolines. The superior EL results for PPyBT relative to PBTPV can be traced to its larger hole confinement energy (ΔIP=0.49 eV). The polyanthrazolines combine unfavorable barrier to interface electron transfer (ΔEA=0.1–0.18 eV) with small barriers to hole transfer, resulting in only marginal EL enhancement. In fact, in PPV/PTDA there is no barrier to hole transfer and not surprisingly no EL enhancement was observed compared to the PPV single layer. Although PPV/BBL bilayer LED has a large barrier to hole transfer (ΔIP=0.8 eV), however, it also has a large barrier to electron transfer (ΔEA=1.29 eV) at the interface which precludes any light emission.

To understand why the energetics of the polymer/polymer interface can dominate the EL efficiency $\phi_{EL}$ and luminance, the main factors that determine EL diode efficiency should be considered. In organic LEDs, in general, $\phi_{EL}=\gamma \cdot \eta \cdot \phi_{PL}$ where γ is the charge injection efficiency, η is the efficiency of singlet exciton generation from electron-hole recombination, and $\phi_{PL}$ is the fluorescence quantum yield of the emissive polymer layer (Friend et al., 1999). (In the case of emission from both layers, $\phi_{EL}=\gamma^1 \cdot \eta^1 \cdot \phi_{PL}^1 + \gamma^2 \cdot \eta^2 \cdot \phi_{PL}^2$, where the superscripts 1 and 2 represent different polymer layers.) Focusing on the emissive PPV layer which is a constant in all the bilayer heterojunctions, one sees that $\phi_{PL}$ does not vary with heterojunction composition. As previously discussed, since the bilayer LED performance (e.g. $\phi_{EL}$) did not increase with increasing electron affinity, the electron injection efficiency γ is likely to be very high and about the same in all the heterojunctions. Thus, what varies widely in these heterojunctions is the singlet exciton generation efficiency of charge recombination η. For example, although the charge injection efficiency γ of the ITO/PPV/BBL/Al diode is near unity because of ohmic contacts, the fact that $\phi_{EL}$~0 can be understood to arise from the negligible radiative recombination (η~0) due to interfacial photoinduced electron transfer and charge separation facilitated by the interfacial electronic structure.

Figure 10:
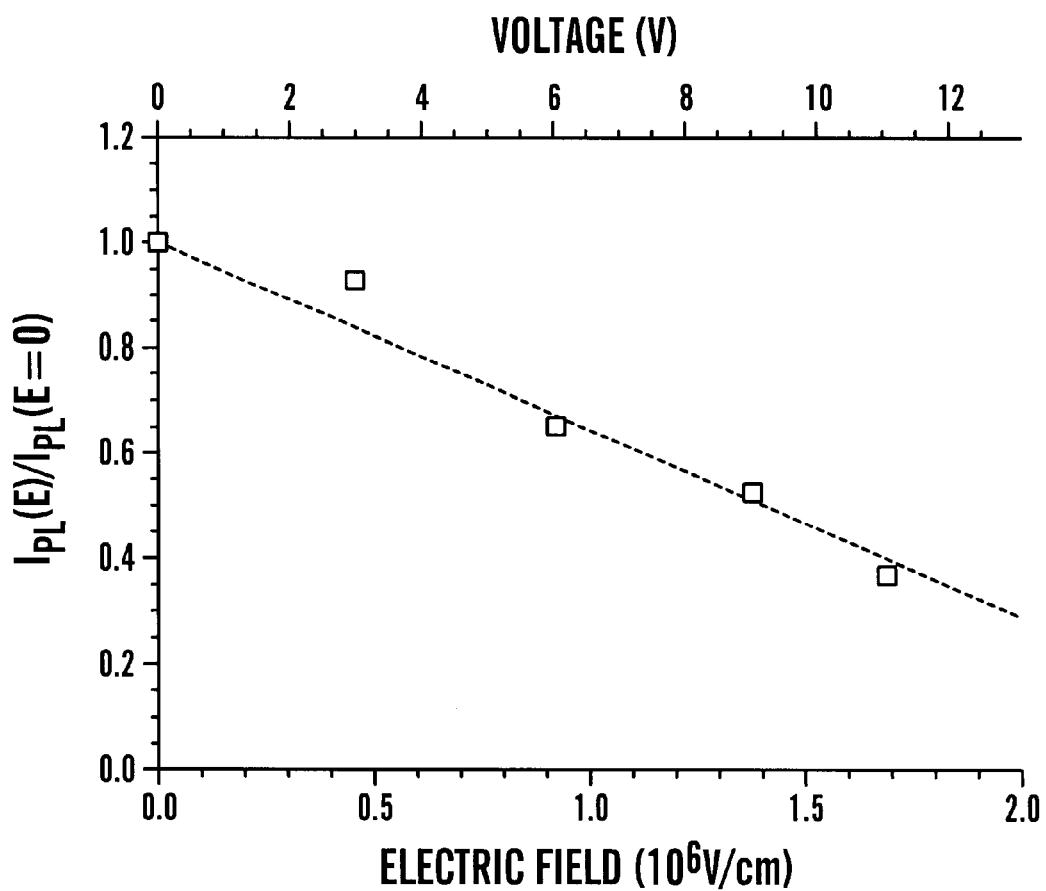
FIG. 10 is a graph illustrating electric field-induced quenching of PL in the ITO/PPV/PBPQ/Al diode under reverse bias. The excitation wavelength was 470 nm.

The electric field dependence of electron-hole recombination and the competing process of exciton (electron-hole) dissociation in these bilayer heterojunctions, and hence η, can also be expected to depend on the composition and interfacial electronic structure of the bilayer (Deussen et al., 1995). An unusual maximum appearing in the luminance-voltage curves of the heterojunction LEDs provided additional evidence of the critical role of the polymer/polymer interface in the net η and diode performance. The luminance of the previously discussed ITO/PPV/PBPQ/Al diode was found to have a maximum at 9.5 V (FIG. 8B). Above this bias voltage, the luminance decreased with increasing voltage even though the current was increasing monotonically. The bias voltage (electric field) where the luminance peaked varied with bilayer composition (Table 2). Such a peak in the luminance-voltage curve has not been observed in either single-layer diodes or bilayer LEDs involving a non-conjugated polymer layer (Friend et al., 1999; Kraft et al., 1998; Zhang et al., 1999). The most likely explanation for this peak in the luminance-voltage curve is electric field-induced quenching of luminescence due to increasing electron-hole (exciton) dissociation with increasing electric field (Chen et al., 1997(b); Deussen et al., 1995). Electric field modulated PL spectroscopy was applied (Chen et al., 1997(b)) to investigate the ITO/PPV/PBPQ/Al diode under reverse bias voltages that does not give rise to EL emission. The relative PL intensity, $I_{PL}(E)/I_{PL}(0)$, is seen to decrease with increasing electric field, reaching a value of 0.4 at ~1.6×10$^6$ V/cm (FIG. 10). This result shows that there is a 60% quenching of luminescence by a high electric field (>10 V). The efficiency of charge photogeneration at the polymer/polymer interfaces at comparable electric fields is known to be strongly dependent on the bilayer composition and particularly the interface electronic structure (ΔEA, ΔIP) (Zhang et al., 1996; Zhang et al., 1997(a); Osaheni et al., 1994(a); Osaheni et al., 1994(b); Abkowitz et al., 1992; Antoniadis et al., 1993).

Example 5

Voltage-tunable Multicolor Electroluminescence from Bilayers

A key observation in earlier (Jenekhe et al., 1997; Zhang et al., 1998(b)) and present studies of the bilayer heterojunction LEDs of the type ITO/PPV/n-type polymer/Al (FIG. 2A) was the dramatic effect of the layer thicknesses on the EL color and its voltage dependence. If the thickness of the PPV layer was in the range of 60–120 nm and that of the n-type polymer was thinner, green light emission which is characteristic of the single-layer PPV diode was obtained at all applied bias voltages. Similarly, an emissive n-type polymer layer of 60–120 nm in combination with a thinner PPV layer always resulted in orange or red emission which is characteristic of the n-type polyquinoline layer at all bias voltages. In contrast to these conventional single-color polymer LEDs, the bilayer heterojunction LEDs exhibit novel voltage-dependent multicolor EL emission if the layer thicknesses are in the range of 25–50 nm. In the following, results of studies aimed at the understanding of the mechanisms of such a voltage-tunable EL emission from the bilayer heterojunctions, size effects, and the roles of the polymer/polymer interfaces are presented and discussed.

Figure 11:
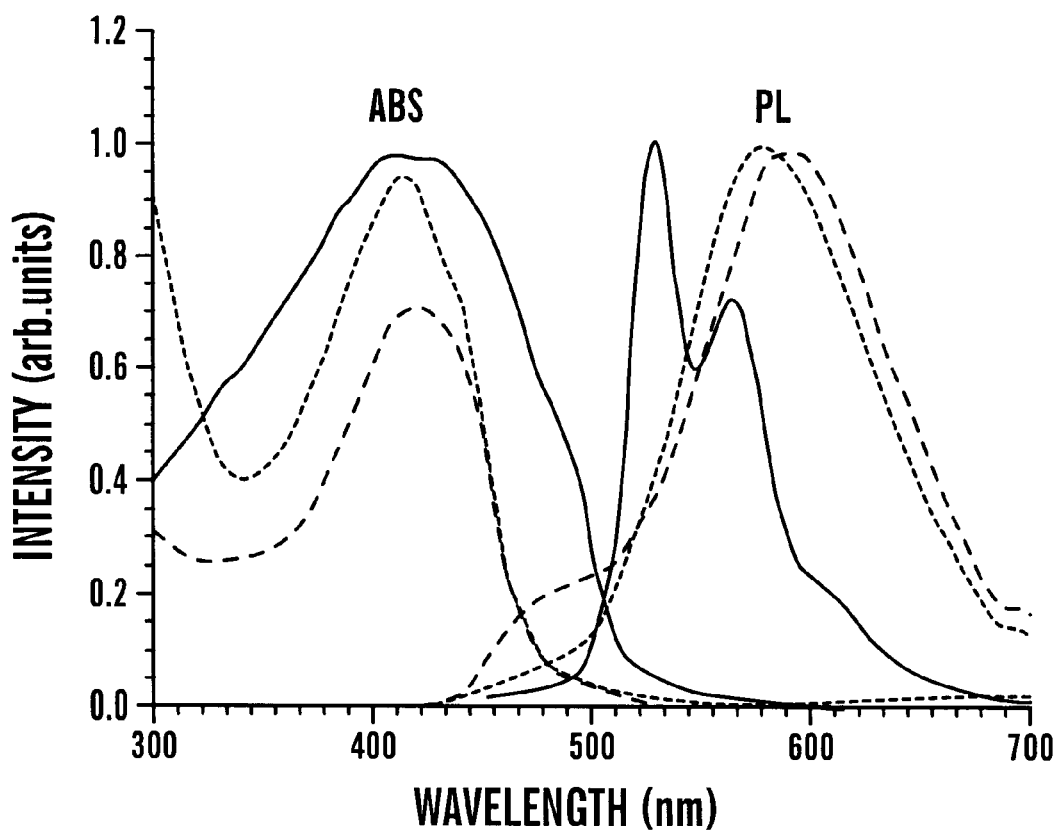
FIG. 11 is a graph illustrating optical absorption (ABS) and photoluminescence (PL) spectra of PPV (solid line), PPQ (dotted line), and PSPQ (dashed line) thin films on silica substrates. The excitation wavelength was 400 nm for all three polymers.
Figures 12A, 12B, 12C:
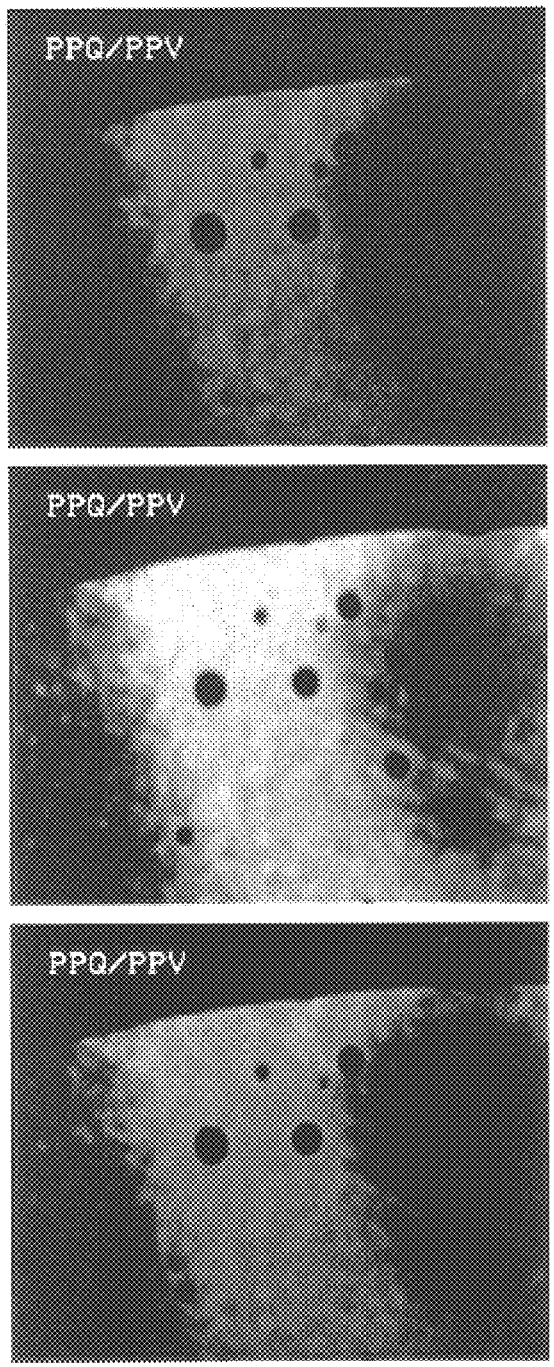
FIGS. 12A–C are images of EL micrographs (×40) of the ITO/PPV(35 nm)/PPQ(35 nm)/Al diode at 7, 9, and 12 V. The corresponding EL spectra are shown in FIG. 14B.

The photoluminescence (PL) and optical absorption spectra of single-layer thin films of PPV, PPQ (2), and PSPQ (3d) are shown in FIG. 11. PPV thin film has a broad absorption band with a peak at 408 nm and absorption edge at ~515 nm. The PL spectrum of PPV is highly structured with vibronic peaks at 528 and 559 nm. PPQ thin film has an absorption peak at 414 nm and a PL emission peak at 578 nm. In the case of PSPQ thin film, the absorption and PL emission peaks are at 414 and 590 nm, respectively. The photophysical data (absorption maxima $\lambda_{max}^{ABS}$, absorption edge gap $E_g^{opt}$, and PL emission maxima $\lambda_{max}^{PL}$) for all the polymers are collected in Table 1. The photophysical data, exemplified by those in FIG. 11, show that there is little or no overlap between the absorption of PPV and the emission of the n-type polymers listed in Table 1. Therefore, light emitted from the n-type polymer layer in a ITO/PPV/n-type polymer/Al diode can exit from the ITO side without any significant reabsorption by the PPV layer. This fact together with the different emission colors of the p-type (PPV) and n-type polymer layers facilitated the observed multicolor EL emission from the bilayer heterojunction diodes.

Voltage-tunable multicolor EL emission of the bilayer heterojunction LEDs is exemplified by the ITO/PPV(35 nm)/PPQ(35 nm)/Al diode which switches reversibly from red (7 V) to yellow (9 V) and to green (12 V). These multicolor switching by the applied bias voltage were observed visually and also by EL microscopy. Typical EL micrographs of a color tunable PPV/PPQ diode are shown in FIGS. 12A–C and 13A–O. In addition to the three main colors (red/orange⇌yellow⇌green) (FIGS. 12A–C) seen at 7, 9 and 12 V, continuous variation of the bias voltage within the range of 6–13 V gives rise to more than 8 shades of color (FIGS. 13A–O). The dark spots seen in the EL micrographs are very similar to those previously observed in organic LEDs (Do et al., 1994; Fujuhira et al., 1996; McElvain et al., 1996) and are nonemissive areas due to defects. An important difference between the dark spots seen here in the EL micrographs of polymer/polymer bilayer LEDs and those reported in small molecule organic/organic LEDs (Do et al., 1994; Fujuhira et al., 1996; McElvain et al., 1996) is that the size and distribution of dark spots in the present diodes (FIGS. 12–13) do not grow with increasing voltage or time. This suggests that the dark spots seen here are pre-existing defects associated with the device fabrication and are not evidence of EL diode degradation sites.

Figure 14A:
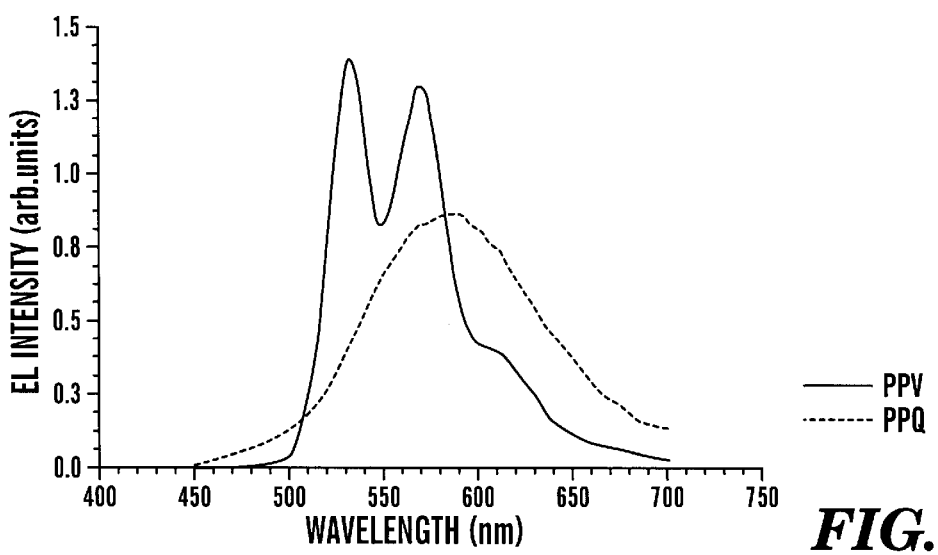
FIGS. 14A–C are graphs illustrating (14A) EL spectra of single-layer ITO/PPV(70 nm)/Al diode at 8 V and ITO/PPQ (30 nm)/Al diode at 8 V; (14B) EL spectra of ITO/PPV(35 nm)/PPQ(35 nm)/Al diode at forward bias voltages of 7, 9, and 12 V; and (14C) deconvolution of the EL spectrum of ITO/PPV(35 nm)/PPQ(35 nm)/Al diode at 12 V.
Figure 14B:
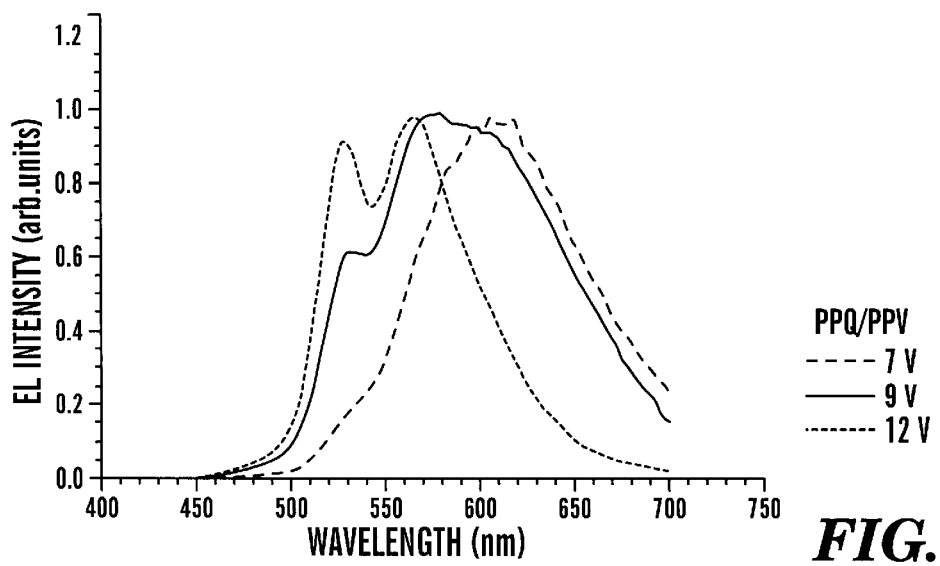
Figure 14C:
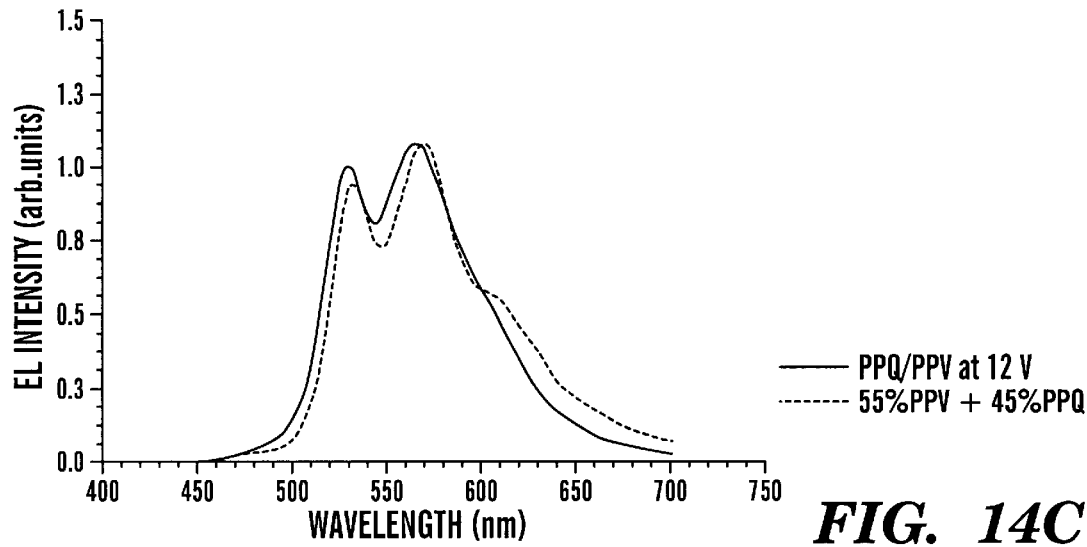

The EL spectra of single-layer ITO/PPV/Al and ITO/PPQ/Al diodes are shown in FIG. 14A. The single-layer PPV diode emits green light with peaks at 527 and 559 nm; the single-layer PPQ diode emits orange/red light with a broad band and peak at 589 nm. The voltage-tunable EL spectra corresponding to the EL micrographs of FIG. 12 for the PPV/PPQ bilayer diode are shown in FIG. 14B. The EL spectrum at 7 V has a peak at 615 nm, showing the characteristic red/orange PPQ emission. The EL spectrum at 9 V has a shoulder at 530 nm and a peak at 570 nm, which is completely different from that of either component. The 9 V EL spectrum is actually a superposition of those of the component polymers as demonstrated by its deconvolution which showed 25% contribution from the PPV layer and 75% from the PPQ layer. The EL spectrum at 12 V has peaks at 529 and 566 nm. Although the 12 V EL spectrum and green color are very close to the single-layer PPV diode, the EL spectrum has some contribution from the PPQ layer as shown in the simulation of FIG. 14C. These results clearly show that multicolor EL emission from the bilayer heterojunction diodes originates from the mixing of light colors emitted from the two different emissive layers.

Figure 15:
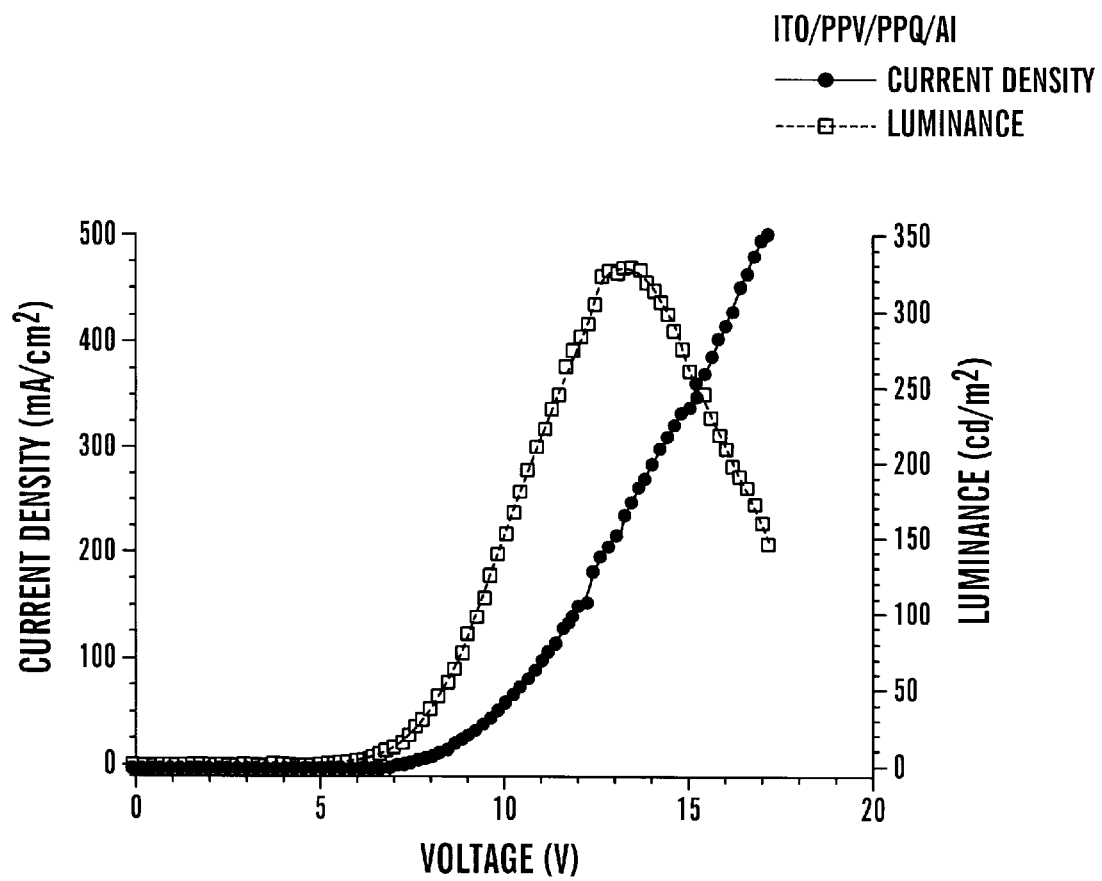
FIG. 15 is a graph illustrating the current density-voltage and luminance-voltage characteristics of the color-tunable ITO/PPV(35 nm)/PPQ(35 nm)/Al diode.

The performance of the voltage-tunable multicolor ITO/PPV/PPQ/Al diode was also substantially enhanced compared to the single-layer devices. The current-voltage and luminance-voltage characteristics of this color-tunable diode are shown in FIG. 15. The turn-on voltage was 4.5 V. The maximum luminance was 324 cm at a current density of 220 mA/cm$^2$ (12.5 V) and the EL efficiency was 1%. These results show that voltage-tunable multicolor light emission from the bilayer heterojunction diodes is both efficient and bright.

Figure 16A:
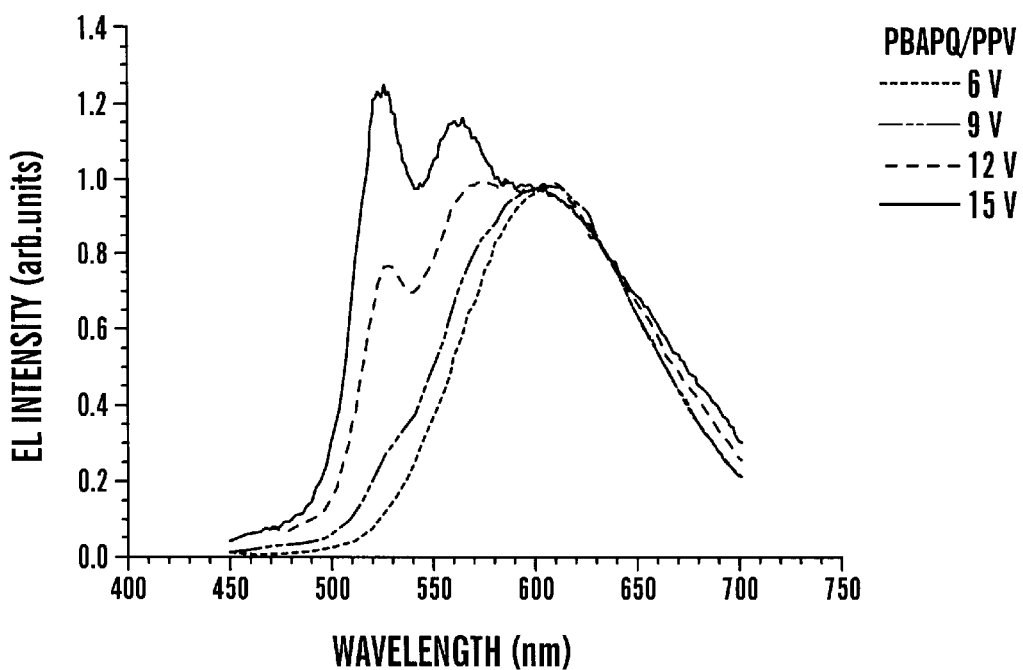
FIGS. 16A–B are graphs illustrating EL spectra of (16A) the ITO/PPV(35 nm)/PBAPQ(35 nm)/Al diode at 6, 9, 12, and 15 V and (16B) the ITO/PPV(35 nm)/PSPQ(35 nm)/Al diode at 6, 9, and 12 V.
Figure 16B:
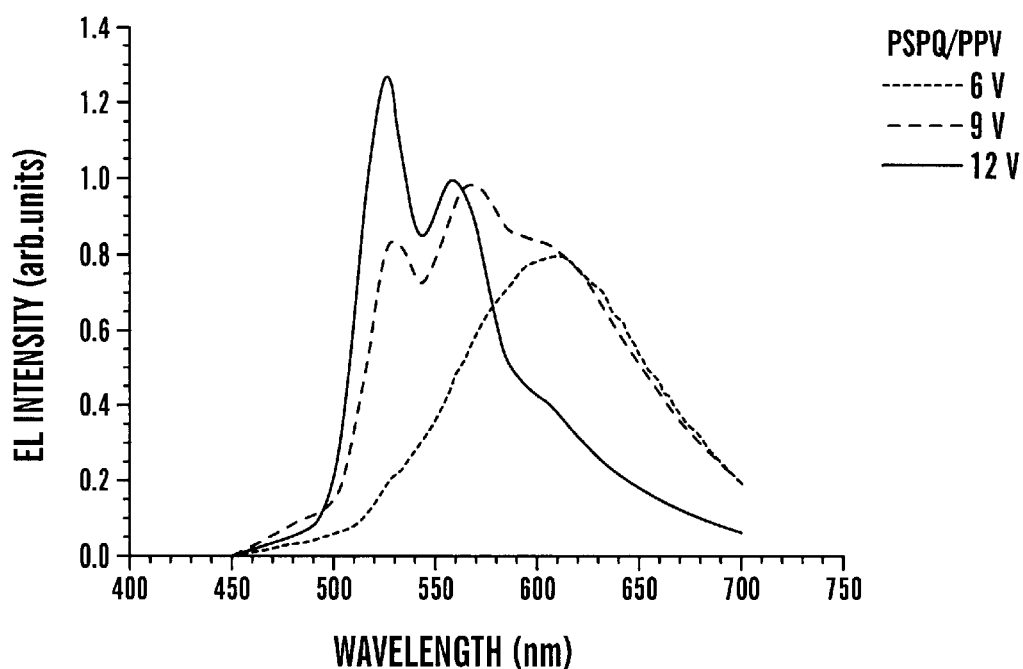

Similar voltage-tunable multicolor EL emission was observed in many other ITO/PPV/polyquinoline/Al diodes. Typical voltage-tunable EL spectra of PPV/PBAPQ and PPV/PSPQ diodes are shown in FIGS. 16A and 16B, respectively. For the PPV/PBAPQ diode, the color switching were: orange (6–9 V)⇌yellow (12 V)⇌green (15 V); the color switching in the PPV/PSPQ diode were: orange/red (6 V)⇌yellow (9 V)⇌green (12 V). Interestingly, in the case of the PPV/PBTPV diode the low voltage (5 V) color was green and the highest voltage (19 V) color was orange/red. The detail results for these and other bilayer heterojunction LEDs are summarized in Table 3 below.

TABLE 3

Single-color and Voltage-tunable Multicolor Polymer Heterojunction LEDs

| Device | Thickness (nm) | $V_{on}$ (V) | EL colors and peaks[a] at applied voltages |
|---|---|---|---|
| PPV | 70 | 7 | green (531/564 nm) |
| PPQ/PPV | 35/35 | 4.5 | red/orange (6 V, 607 nm) <-> yellow (9 V, 578–600 nm) <-> green (12 V, 566/529) <-> green (>12 V, 526/561 nm) |
| | 67/25 | 10 | orange/red (at all voltages, 610 nm) |
| | 40/25 | 7 | orange/red (8–10 V, 614 nm) <-> green (13–20 V, 507/544 nm) |
| | 33/62 | 10 | orange (10–15 V, 592 nm) <-> green (18–20 V, 508/544/588 nm) |
| | 33/117 | 14 | green (548 nm) |
| PPPQ/PPV | 85/25 | 15 | orange (580 nm) |
| | 35/25 | 8 | yellow/orange (10 V, 572 nm) <-> green (20 V, 511/549 nm) |
| | 35/60 | 10 | green (508/544 nm) |
| | 30/35 | 6 | green (528/559 nm) |
| PBPQ/PPV | 30/35 | 3.5 | green (3.5–5 V, 563/528 nm, >5 V, 528/563 nm) |
| | 40/25 | 10 | yellow/orange (10 V, 566 nm) <-> green (20 V, 510/544 nm) |
| | 50/25 | 12 | orange (580 nm) |
| PBAPQ/PPV | 35/35 | 5.5 | orange (6–9 V, 600 nm) <-> yellow (12 V, 530–600 nm) <-> green (15 V, 526/561 nm) |

TABLE 3-continued

Single-color and Voltage-tunable Multicolor Polymer Heterojunction LEDs

| Device | Thickness (nm) | $V_{on}$ (V) | EL colors and peaks[a] at applied voltages |
|---|---|---|---|
| PSPQ/PPV | 35/35 | 5.5 | orange/red (6 V, 606 nm) <-> yellow (9 V, 567/530 nm) <-> green (12 V, 530/558 nm) |
| PPyBT/PPV | 15/60 | 5 | green (510/545 nm) |
| | 30/25 | 6.5 | green (510/545 nm) |
| | 40/25 | 10 | orange (13 V, 510–700 nm band) <-> green (15 V, 544 nm) |
| PBTPV/PPV | 15/60 | 6 | green (510/545 nm) |
| | 35/25 | 3.5 | green (5 V, 510/550 nm) <-> orange/red (19 V, 572 nm) |
| | 50/25 | 12 | red/orange (620 nm) |

[a]If two peaks were shown in EL spectra (p1/p2 nm), p1 is the one with higher intensity.

The main features of these results suggest that the basic mechanism of voltage-tunable multicolor EL emission is the spatial variation of the recombination and emission zone within the bilayer LED. If recombination and emission occur exclusively in one layer, the LED color obtained is that characteristic of that layer. However, if recombination and emission occur in both layers, the EL color results from a physical mixing of those of the two components of the heterojunction LED. The spatial location of charge recombination and hence where light emission occurs and ultimately the EL color of a bilayer heterojunction LED of the type anode/p-type/n-type/cathode is thus controlled by charge transfer across the polymer/polymer interface. All the experimental results suggest that the nature of the charge transfer at a p/n polymer/polymer heterojunction interface can be one of three types: (i) unipolar electron transfer; (ii) unipolar hole transfer; and (iii) combined unipolar (at low electric fields) and bipolar (at high electric fields) charge transfer. These interfacial charge transfer processes are controlled by three main interrelated factors: (a) the sizes of the layers forming the heterojunction interface; (b) the bias voltage or electric field; and (c) the electronic structure or energetics ($\Delta EA$, $\Delta IP$) of the interface. To understand how these factors control interfacial charge transfer and EL color of a bilayer LED we consider the physical parameters defined in FIG. 17.

Figure 17:
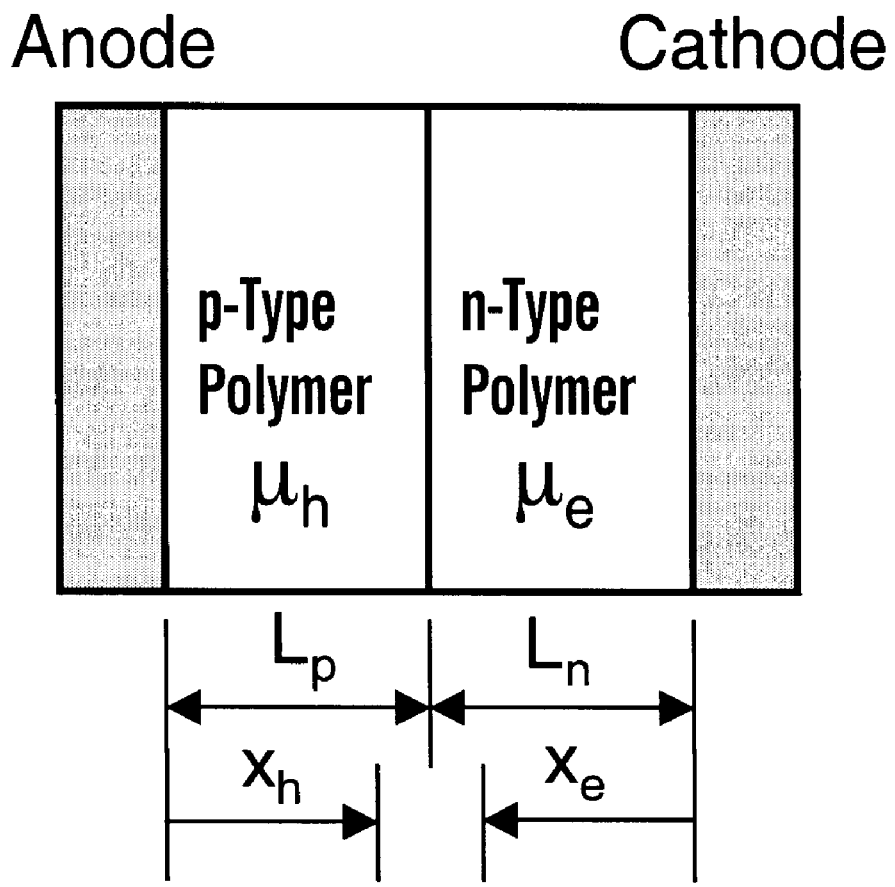
FIG. 17 is a schematic illustration of layer thicknesses ($L_n$, $L_p$) and charge carrier ranges ($x_n$, $x_h$) in p-type/n-type polymer heterojunction LEDs.

The p-type and n-type layer thicknesses of a bilayer diode are denoted $L_p$ and $L_n$, respectively. To achieve EL emission, charge carriers injected at the electrodes migrate under the influence of electric field until they are trapped, or they encounter energy barriers ($\Delta EA$, $\Delta IP$) at the interface, or they recombine. The range of a charge carrier injected into a semiconductor is the mean distance traveled before trapping or recombination (Antoniadis et al., 1994(b); Allen, 1994; Kittel, 1986). The ranges of electrons ($x_n$) and holes ($x_h$) in the semiconducting polymer heterojunction are illustrated in FIG. 17. The range of holes in a semiconducting polymer is approximately the product of hole mobility ($\mu_h$), carrier lifetime ($\tau_h$), and electric field (E): $x_h = \mu_h \tau_h E$ (Antoniadis et al., 1994(b)). Similarly, the range of electrons is approximately given by $x_e = \mu_e \tau_e E$. These ranges are for the respective majority carrier in the semiconductor. Although the ranges of electrons and holes in semiconducting polymers are rarely known, they are expected to be in the nanoscale region. Without being bound thereby, it is believed that the observed finite size effects on the EL emission of the bilayer heterojunctions arise from the limitations imposed on charge transport by the charge carrier ranges in semiconducting polymers. Depending on the relative layer thicknesses ($L_p$, $L_n$) of a bilayer LED and the applied electric field, two limiting situations corresponding to unipolar charge transfer across the interface arise. If the n-layer thickness is less than the electron range ($L_n < x_e$) and the p-layer thickness is greater than the hole range ($L_p > x_h$), unipolar electron transfer across the polymer interface occurs and EL emission from only the p-layer is observed at all bias voltages. Heterojunction LEDs with relatively thick PPV layers (see Table 3) fall into this category. On the other hand if the n-layer thickness is greater than the electron range ($L_n > x_e$) and the p-layer thickness is less than the hole range ($L_p < x_h$), unipolar hole transfer across the polymer/polymer interface occurs and EL emission from only the n-layer is observed at all bias voltages. This is the case of the ITO/PPV(25 nm)/PPQ(67 nm)/Al diode which emits orange/red, characteristic of PPQ, at all bias voltages.

The most interesting case of combined unipolar and bipolar charge transfer across the polymer/polymer interface and associated voltage-tunable multicolor EL emission arises when both the n-layer and p-layer thicknesses are comparable to or less than the electron and hole ranges ($L_n \leq x_e$, $L_p \leq x_h$). At low voltages either unipolar hole transfer, and hence emission from the n-type layer, or unipolar electron transfer and emission from the p-type layer is observed depending on the composition of the bilayer heterojunction. At high voltages bipolar charge transfer takes over, facilitating EL emission from both layers. The PPV(25 nm)/PBTPV(35 nm) diode exemplifies the switch from unipolar electron transfer to bipolar charge transfer with green (5 V) ⇆ orange/red (19 V) reversible switching of colors. All the other bilayer LEDs switch from unipolar hole transfer to bipolar charge transfer similar to the previously discussed PPV(35 nm)/PPQ(35 nm) diode (Table 3). The reason for this is likely due to the much higher mobility of holes in PPV than the mobility of electrons in the n-type polymers ($\mu_h > \mu_e$) except perhaps in PBTPV. The strong electric field (bias voltage) dependence of EL color (spectra) arises mainly from the strong and sensitive dependence of the charge carrier ranges in semiconducting polymers on electric field since both the mobility ($\mu_i$) and carrier lifetime ($\tau_i$) appearing in the expressions, $x_i = \mu_i \tau_i E$, where the subscript i denotes either h (holes) or e (electrons), are also strong functions of the electric field.

The observed critical dependence of the electronic and optical properties (e.g. EL emission spectrum, efficiency, and luminance) of polymer/polymer heterojunctions on the relative nanoscale sizes of the bilayer components constitutes an interesting class of finite size effects which are yet to be fully explored in organic semiconductors. In the present context, it was observed that there is a coupling between the properties of polymer/polymer interfaces (e.g. $\Delta EA$, $\Delta IP$) which can be achieved through molecular design and synthesis and those due to finite size effects which must be controlled through nanoscale materials processing.

The above results on bilayer semiconducting polymer heterojunctions demonstrate the potential of multicomponent EL polymer systems for developing efficient and bright light emitting devices. The novel feature of continuous voltage-tunable multicolor emission from the heterojunction LEDs suggests full-color displays, color-switchable panels, and other applications. Pixels of multicolors could be easily fabricated by using conventional photolithography, microcontact printing or ink-jet printing techniques (Friend et al., 1999; Kraft et al. 1998). Although the present PPV/polyquinoline heterojunctions had voltage-tunable colors in the range red⇌yellow⇌green, other bilayer (red+blue, blue+green) and trilayer (red+green+blue) heterojunctions involving p-type polymers such as poly(p-phenylene) (PPP) (Leising et al., 1996; Leising et al., 1997) and polyfluorene (PF) (Grice et al., 1998; Pei et al., 1996; Lee et al., 1999) can readily extend the accessible multicolors throughout the CIE diagram. The combination of three EL polymers having three different primary colors (red, green, blue) could also be achieved in a bilayer heterojunction LED if one of the layers is a binary blend. In addition to blue⇌green⇌red type of color switching, such heterojunction LEDs may also be capable of white light emission.

In the light of the present results, the goals of molecular design and synthesis of semiconducting polymers for EL devices should include the electronic structure of polymer/polymer interfaces in addition to achieving high solid-state PL efficiency and good charge transport. For single-color LEDs, this means that if the p-type layer of a bilayer heterojunction is to serve as the emissive layer, the desired interfacial electronic structure is $\Delta AE<0$ and $\Delta IP>>0$. Similarly, the EL emission of the n-type layer would be maximized if the bilayer heterojunction is such that $\Delta IP<0$ and $\Delta EA>>0$. Coupled to these molecular parameters (IP/HOMO, EA/LUMO) is the choice and manipulation of the nanoscale layer thicknesses ($L_p$, $L_n$). If either $L_p$ or $L_n$ is relatively large compared to the charge carrier ranges in the component semiconducting polymers, single-color LEDs would be obtained. If the relative layer thicknesses are comparable to the charge carrier ranges, voltage-tunable multicolor EL emission is to be expected. Clearly, control of the finite size effects in heterojunction LEDs is largely through appropriate nanoscale materials processing. The relative sizes of layered polymer/polymer heterojunction devices can be readily controlled during the fabrication process. However, the scale of phase separation in blends of EL polymers is more difficult to control, particularly at the nanoscale level (Berggren et al., 1994). Although microphase separation of block copolymers generally results in nanostructures and, hence, would ideally allow the control of finite size effects, there are currently only few examples of luminescent block conjugated polymers (Chen et al., 1996; Wagaman et al., 1997; Chen et al., 1997(b); Chen et al., 1997(c)) for possible use in LEDs.

The ability to predict the EL emission color of a multicomponent polymer system from those of the component EL spectra also depends on the extent of any intermolecular photophysical processes such as energy transfer (Yang et al., 1994; Lee et al., 1996; Tasch et al., 1997), exciplex formation (Jenekhe et al., 1994; Osaheni et al., 1994(c); Gebler et al., 1997; Gebler et al., 1998), or photoinduced electron transfer (Chen et al., 1997(a); Jenekhe et al., 1996). Tunable multicolor EL emission from the bilayer heterojunction LEDs investigated here was best controlled in the absence of any intermolecular photophysical processes. Bilayers with significant photoinduced electron transfer, such as the PPV/BBL system, had very poor light emitting properties. Knowledge of the electronic structures (IP/HOMO, EA/LUMO) and photophysical properties of the components can be used to estimate the likelihood of intermolecular photophysical processes across the polymer/polymer interfaces in layered thin films, phase-separated blends or microphase-separated block copolymers. Although energy transfer and exciplex formation are undesirable complications in tunable multicolor EL polymer systems, each can separately be used to enhance emission in single-color devices (Jenekhe et al., 1994; Osaheni et al., 1994(c); Gebler et al., 1997; Gebler et al., 1998; Yang et al., 1994; Lee et al., 1996; Tasch et al., 1997; Yu et al., 1995; Zhang et al., 1997(b)).

Example 6

Fabrication of Alternative Polymer/Polymer Heterojunction LEDs

Alternative to the use of PPV, hole transfer layers can also be prepared using either polystyrene doped with 1,1-Bis(di-4-tolylaminophenyl)cyclohexane (TAPC) or poly(vinylcarbazole) (PVK). TAPC was provided by Eastman Kodak Company. Polystyrene (PS) with a molecular weight ($M_n$) of ~200,000 and PVK ($M_n$=100,000) were obtained from Polysciences. PVK was only used for BuM-PPQ and BuN-PPQ devices.

Thin films (50 nm) of TAPC:PS (50 wt %) or PVK were deposited onto ITO coated glass substrates by spin coating (as described in Example 1) from dichloromethane solutions.

Example 7

Analysis of Polyquinolines and Polyquinoline Derivatives

The $\pi$-$\pi$* transition has a lowest energy absorption maximum ($\lambda_{max}$) at 414 nm and an absorption edge ($E_g^{opt}$) of 2.65 eV. The lowest energy transitions in the absorption spectra and estimated optical gaps of several previously identified polyquinolines (FIG. 3) and derivatives thereof are collected in Table 4 below.

TABLE 4

Optical Absorption and Redox Properties of Polyquinoline Thin Films

| Polymer | $\lambda_{max}$, nm | $\alpha,^a$ $10^5$ cm$^{-1}$ | $E_g^{opt,b}$, eV | $E^{red,c}$, V | $E^{ox,c}$, V |
|---|---|---|---|---|---|
| 2, PPQ | 414 | 1.12 | 2.65 | −1.78 | 0.95 (0.87)$^d$ |
| Bu-PQ | 412 | 0.69 | 2.65 | −1.86 | 0.78 (0.79) |
| 3a, PPPQ | 400 | 1.31 | 2.78 | −1.90 | 1.07 (0.88) |
| 3b, PBPQ | 405 | 1.17 | 2.81 | −1.98 | 1.09 (0.83) |
| 3c, PBAPQ | 407 | 1.12 | 2.72 | −1.93 | 1.08 (0.79) |
| 3d, PSPQ | 414 | 1.13 | 2.65 | −1.92 | 0.95 (0.73) |
| 3e, PDMPQ | 380 | 0.67 | 3.01 | −2.04 | 1.04 (0.97) |
| 3f, PTPQ | 471 | 1.09 | 2.49 | −1.84 | 0.87 (0.65) |
| Bu-PPQ | 399 | 0.78 | 2.78 | −1.58 | 0.99 (1.20) |
| BuM-PPQ | 358 | 0.47 | 3.10 | −1.95 | 1.35 (1.15) |
| BuN-PPQ | 347 | 0.44 | 3.26 | −2.00 | 1.31 (1.26) |

$^a$Data for solid films at absorption $\lambda_{max}$.
$^b$Optical absorption edge gap ($E_g^{opt}$).
$^c$Onset potentials versus SCE from Agrawal et al., 1996, except Bu-PQ, Bu-PPQ, BuM-PPQ, and BuN-PPQ.
$^d$E$^{ox}$ determined from E$^{ox}$ = $E_g^{opt}$ − |E$^{red}$|.

The optical absorption spectra revealed that most of the polyquinolines (PPQ, Bu-PQ, PPPQ, Bu-PPQ, PBPQ, PBAPQ, and PSPQ) have similar $\pi$-$\pi$* transitions with $\lambda_{max}$ at 399–414 nm (Table 4). The $\pi$-$\pi$* transition showed a gradual small red-shift, suggesting increasing electron delocalization along the chain as the linkage changed from phenylene (3a, PPPQ) to biphenylene (3b, PBPQ), ethynylene biphenylene (3c, PBAPQ), and acetylene biphenylene (3d, PSPQ). The most striking red-shift was observed in PTPQ with the thienylene linkage (3f), showing the π-π* absorption maximum at 471 nm compared to 400 nm for PPPQ (3a). On the other hand, PDMPQ (3e) in which the conjugation was disrupted by a methylene linkage showed a blue-shift (380 nm) in absorption maximum compared to PPPQ.

Introduction of tert-butyl substitution on the phenyl side group does not appear to affect the ground state electronic structure of the polyquinolines, which was evident upon comparison of the absorption spectra of PPQ to Bu-PQ, and PPPQ and Bu-PPQ. Bu-PQ has essentially the same absorption peak (412 nm) as PPQ (2) (414 nm). Bu-PPQ has an identical absorption peak and edge as PPPQ (3a). However, substitution of methyl or nonyl side groups to the bis(quinoline) rings caused large changes on the electronic structure of the polymer. BuM-PPQ and BUN-PPQ have absorption $\lambda_{max}$ at 358 and 347 nm, respectively, which are substantially blue-shifted from the parent Bu-PPQ with absorption peak at 399 nm (Table 4). These effects of methyl and nonyl substitutions indicate that electron delocalization is disrupted along the chain. These optical absorption spectra and their dependence on main chain and side group variations can be understood in terms of the effects of geometric structure on the ground state electronic structure of the polyquinolines. Similar effects of intramolecular and supramolecular interactions on the photophysical properties of oligoquinolines have been found in oligomers investigated by single crystal X-ray diffraction. From the oligoquinoline crystal structures it is clear, for example, that a twist angle exist between the plane of the bis(quinoline) rings and the plane of the aromatic R-linkage. The twist angle varied with the R moiety and also with the 3,3'-alkyl substitutions on the bis(quinoline) rings.

In addition to the lowest energy optical transition whose $\lambda_{max}$ and absorption edge ($E_g^{opt}$) are listed in Table 4, a second higher energy absorption band was commonly observed in most of the polyquinolines. In the case of the basic polyquinoline PPQ (2), the higher energy peak at 290 nm actually has a slightly larger oscillator strength than the lowest energy band at 414 nm. The ratio of the oscillator strength of the lowest energy transition to that of the higher energy transition was found to vary with molecular structure. The absorption coefficient α at the lowest energy $\lambda_{max}$ shown in Table 4 also vary considerably with polyquinoline structure. It is expected that the excited state properties of the polyquinolines will be similarly regulated by molecular structure.

The thin film photoluminescence (PL) spectrum of the basic polyquinoline PPQ (2) is characterized by a PL peak at 578 nm, emitting orange light. In contrast, the PL spectra for BUM-PPQ, PDMPQ (3e), Bu-PPQ, PPPQ (3a), and PTPQ (3f) have PL emission peaks at 426, 534, 554, 574, and 622 nm, respectively. The thin film PL peaks and PL efficiencies of all the polyquinolines are listed in Table 5 below. The steady-state PL spectra thus show that the emission colors of the polyquinolines can be tuned from blue (BuM-PPQ and BuN-PPQ) to green (PDMPQ), yellow (Bu-PPQ), orange (PPQ, Bu-PQ, PPPQ, PBPQ, PBAPQ, and PSPQ), and red (PTPQ).

TABLE 5

PL and EL Properties of Polyquinoline Thin Films

| Polymer | $\lambda_{max}^{PL,a}$, nm | $\phi_{PL}$, % | $\lambda_{max}^{EL}$, nm | h,[b] nm | $V_{on}$, V | Luminance/I/V, cd/m², mA/cm², V | $\phi_{EL}$, % |
|---|---|---|---|---|---|---|---|
| 2, PPQ | 578 | 10 | 589 | 30 | 7 | 130/235/17.5 | 0.46 |
| Bu-PQ | 571 | 20 | 586 | 60 | 9 | 100/80/22 | 0.92 |
| 3a, PPPQ | 574 | 10 | 580 | 50 | 9 | 70/145/20 | 0.46 |
| 3b, PBPQ | 571 | 9 | 557 | 30 | 7 | 60/500/15 | 0.15 |
| 3c, PBAPQ | 564 | 9 | 554 | 35 | 7 | 114/500/16 | 0.20 |
| 3d, PSPQ | 590 | 3 | 585 | 35 | 7 | 26/270/15 | 0.10 |
| 3e, PDMPQ | 542 | 12 | 534 | 35 | 7 | 60/60/15 | 0.92 |
| 3f, PTPQ | 622 | 2 | 622 | 40 | 5 | 10/500/12 | 0.02 |
| Bu-PPQ | 554 | 30 | 554 | 50 | 8 | 280/100/20 | 1.08 |
| BuM-PPQ | 425 | 8 | 426 | 45 | 11[c] | 7/55/20 | 0.15 |
| BuN-PPQ | 424 | 9 | 410 | 33 | 10[c] | 15/100/19 | 0.15 |

[a]PL obtained by exciting at absorption $\lambda_{max}$.
[b]h = film thickness of polyquinoline in EL devices.
[c]All LED data for HTL = TAPC, except BuM-PPQ and BuN-PPQ where HTL = PVK.

By comparing the optical absorption and PL spectra of the polyquinolines, it can be seen that polyquinolines PPQ (2), PPPQ (3a), PBPQ (3b), PBAPQ (3c), PSPQ (3d), PDMPQ (3e), PTPQ (3f), and Bu-PPQ have large Stokes shifts of 160–180 nm which is characteristic of excimer emission of solid films of many conjugated polymers (Jenekhe et al., 1994). On the other hand, polyquinolines BuM-PPQ and BuN-PPQ have much smaller Stokes shifts (67–77 nm). All the polyquinolines have broad, featureless, emission bands which are also characteristics of excimers or aggregates (Jenekhe et al., 1994). From the previously cited single crystal X-ray diffraction structures of oligoquinolines it is known that the corresponding polymers such as PPPQ (3a) and PTPQ (3f) have essentially planar backbone structures with intermolecular face-to-face distance of ~3.5 Å. In contrast, similar oligomer data indicate that BuM-PPQ and BUN-PPQ have non-planar chain structures and relatively large intermolecular distances of ~10 Å. Thus, the solid state emission of most of the polyquinolines originates from excimers. The emission bands of BuM-PPQ and BuN-PPQ, however, are tentatively assigned to emission from ground state intermolecular aggregates in view of the relatively large intermolecular distances of their oligomers.

Most of the polyquinolines, including 3a–e, have solid state PL efficiencies of about 10% which is similar to the parent polyquinoline PPQ (2). The two blue-emitting polymers BuM-PPQ and BuN-PPQ with apparent aggregate emission also have PL efficiencies comparable to PPQ. However, two polyquinolines with tert-butyl substitutions (Bu-PQ and Bu-PPQ) have higher PL efficiencies (20–30%) compared to related polymers without tert-butyl substitutions. It is remarkable that the side group tert-butyl substituents in Bu-PQ and Bu-PPQ result in factors of two and three enhancements in PL quantum efficiency compared to the parent polymers PPQ (2) and PPPQ (3a), respectively, with only minor emission spectral shifts. This suggests that although the basic excited state electronic structure of 2 and 3a is only slightly modified by such a substitution, the changes in intermolecular packing dramatically reduce quenching of emission yield. That the luminescence efficiency of conjugated polymer thin films could be controlled by side chain substituents or copolymerization which regulate chain packing or intermolecular interactions was previously suggested in a broader context (Jenekhe et al., 1994) but only demonstrated in random rod/coil copolymers (Osaheni et al., 1995(b); Jenekhe and Osaheni, 1994). The fact that the PL efficiencies of BuM-PPQ and BuN-PPQ are similar to that of PPPQ (3a) but substantially lower than that of Bu-PPQ clearly shows that some side group substitutions are more effective than others in enhancing luminescence efficiency through control of intermolecular interactions. From the present results we see that those side group substitutions which also cause significant main chain twisting, as in BuM-PPQ and BuN-PPQ, are least effective. The reason for this appears to be that the twisting of the main chain of the conjugated polymer can induce a large change in the ground state and excited state electronic structures of the fluorescent polymer.

Among all the polyquinolines, PSPQ (3d) and PTPQ (3f) have the lowest solid state PL quantum yield, 2–3% (Table 5). These correspond to the bis(phenylene) vinylene (3d) and 2,5-thienylene (3f) linked polyquinolines. The approximately factor of 3 reduction in PL emission efficiency of 3d relative to 3a–c is unclear but may be due to luminescence quenching arising from photooxidation of the vinylene linkage given the age of the polymer sample and the fact that all the thin film processing and photophysical measurements were done under ambient laboratory air. In the case of PTPQ, the small emission quantum yield may be largely because of the dominant effect of intramolecular charge transfer (ICT) between the bis(quinoline) and thiophene rings. Lending credence to this interpretation is the fact that the PL emission efficiency of a related thiophene-linked polyquinoxaline is about two orders of magnitude less than PTPQ (Cui et al., 1999); ICT is stronger in thiophene-quinoxaline chains than thiophene-quinoline materials because the quinoxaline ring is a stronger electron acceptor than the quinoline ring.

Since an integrating sphere was not used to measure the solid state PL quantum efficiencies in Table 5, they are not absolute values but good lower bound estimates of the absolute quantities (Greenham et al., 1995). More importantly, the PL quantum yield data provide an excellent basis for comparing the series of polyquinolines as emissive materials for LEDs. The variation of PL quantum efficiency between 2 to 30% among the series of polyquinolines is interesting in revealing the effects of molecular and supramolecular structures on the luminescence efficiency. Since the EL device quantum efficiency ($\phi_{EL}$) in organic LEDs is directly proportional to the PL quantum yield ($\phi_{PL}$), $\phi_{EL}$=f·γ$\phi_{PL}$ where f is the efficiency of exciton generation from electron-hole combination and γ is the charge injection efficiency (Friend et al., 1999), this suggests that a similar correlation of molecular and supramolecular structures with EL properties of the polyquinolines may be possible. However, charge injection and transport processes in the polymer LEDs may also vary substantially in the series of polyquinolines depending on the highest occupied molecular orbital (HOMO) and lowest unoccupied molecular orbital (LUMO) levels. Therefore, to better understand how the various factors influence the electroluminescence of the polyquinolines it is necessary to know the HOMO/LUMO levels of the series of polymers and to fabricate and evaluate LEDs under identical conditions. Results of such studies will be discussed in subsequent sections.

In examining PL decay curves for numerous polyquinolines and their derivatives, it was found that the PL decay dynamics of all the polyquinolines, except BuM-PPQ and BuN-PPQ, can best be described by three-term exponential functions with one dominant lifetime. The best fit three lifetimes and their amplitudes for each polymer are given in Table 6 below. The multiple lifetimes needed to describe the PL decay dynamics of the polyquinolines suggest the existence of more than one excited state species or the occurrence of various excited state processes. These PL decay data appear to be consistent with features of aggregation and excimer formation already observed from the steady-state PL data. The dominant PL lifetime of 2, 3a–f, and Bu-PPQ are in the range of 2.42 ns for PTPQ (3f) to 5.22 ns for Bu-PPQ. These excited state lifetimes are unusually long compared to other luminescent conjugated polymers which typically have dominant lifetimes on the order of 100–600 ps (Osaheni et al., 1995(b); Samuel et al., 1995; Osaheni et al., 1994(a); Osaheni et al., 1994(c)).

TABLE 6

PL Decay Dynamics of Polyquinoline Thin Films

| Polymer | $\tau_1$, ns | $\tau_2$, ps | $\tau_3$, ps | Amplitude, % $\tau_1/\tau_2/\tau_3$ |
|---|---|---|---|---|
| 2, PPQ | 4.72 | 1119 | 193 | 62.6/29.5/7.9 |
| Bu-PQ | 4.87 | 1160 | 170 | 67.0/27.0/6.0 |
| 3a, PPPQ | 4.29 | 960 | 130 | 56.5/31.1/12.4 |
| 3b, PBPQ | 3.13 | 694 | 107 | 65.5/24.3/10.2 |
| 3c, PBAPQ | 4.55 | 956 | 125 | 53.4/30.2/16.4 |
| 3d, PSPQ | 3.35 | 734 | 90 | 36.1/32.9/31.0 |
| 3e, PDMPQ | 3.06 | 800 | 127 | 45.9/41.3/12.8 |
| 3f, PTPQ | 2.42 | 718 | 106 | 50.3/36.0/13.7 |
| Bu-PPQ | 5.22 | 1080 | 170 | 69.0/24.1/6.9 |
| BuM-PPQ | 1.53 | 260 | 40 | 15.3/30.3/54.4 |
| BuN-PPQ | 1.80 | 410 | 60 | 18.2/25.7/56.1 |

The dominant PL lifetimes of BuM-PPQ and BuN-PPQ are only 40 and 60 ps, respectively (Table 6). The dramatically shortened lifetimes of these derivatives, compared to all the other polyquinolines, confirm the fundamental difference observed in the steady state emission properties between these two polymers and the remaining polyquinolines. In particular, the shortened lifetimes are very consistent with J-like aggregation of the chromophores (Kobayashi, 1996).

From the PL quantum efficiencies (Table 5) and measured lifetimes (τ) of the polyquinolines (Table 6), the excited state decay rate constants (the radiative rate constant $k_r$ and nonradiative rate constant $k_{nr}$) can be estimated (since $\phi_{PL}=k_r/(k_r+k_{nr})$ and $\tau=1/(k_r+k_{nr})$, the two unknowns can be obtained) (Samuel et al., 1995). For example, PPPQ (3a) with 10% PL quantum efficiency and dominant lifetime of 4.29 ns has a $k_r$~2×10$^7$s$^{-1}$ and $k_{nr}$~2×10$^8$s$^{-1}$. Except BuM-PPQ and BuN-PPQ, the radiative rate constant was of order 10$^7$ to 10$^8$s$^{-1}$ and the nonradiative rate constant was of order 10$^8$ to 10$^9$s$^{-1}$ for all the polyquinolines. The radiative and nonradiative rate constants for BuM-PPQ and BuN-PPQ were of order $10^9 s^{-1}$ and $10^{10} s^{-1}$, respectively. These estimates show that the polyquinolines forming ground state aggregates (BuM-PPQ and BuN-PPQ) have both enhanced emission and nonradiative decay rates compared to those forming excimers. How to reduce the nonradiative rate while preserving the enhanced emission rate in such aggregates of conjugated polymers remains a challenge that must be addressed through molecular and supramolecular engineering strategies.

Charge injection processes and the associated electronic states of conjugated polymer thin films which are important for understanding EL devices can be readily investigated by electrochemical techniques, especially cyclic voltammetry. Cyclic voltammetry (CV) has previously been used to study the redox properties of n-type conjugated polymers and estimate their HOMO/LUMO levels (Yang et al., 1995; Chen et al, 1997(a); Osaheni et al., 1995(a)), including the redox properties and electronic structures of the polyquinolines 2 and 3a–f (Agrawal et al., 1996). However, the electrochemical properties of the recently synthesized polyquinolines Bu-PQ, BuM-PPQ, and BuN-PPQ have not previously been reported. To better understand the electronic structures of these polymers in relation to charge injection characteristics in LEDs, CV measurements were performed on those polymers. For Bu-PQ, the onset reduction and oxidation potentials were found to be −1.86 and 0.78 V versus SCE, respectively. These values are almost the same as those of PPQ (2) (Table 4). Similar to other polyquinolines, Bu-PQ showed a reversible reduction and an irreversible oxidation, indicating that the polyquinolines are intrinsic n-type (electron transport) semiconducting polymers. To facilitate easy comparison the redox potentials for BuM-PPQ and BuN-PPQ are collected in Table 4 together with those for the already reported polyquinolines (Agrawal et al., 1996). Additional data on the redox properties of the polyquinolines, including formal potentials ($E^o$) and peak potentials can be found in a previous report (Agrawal et al., 1996).

The tert-butyl substitution did not cause a significant change in the electrochemical properties of Bu-PQ compared to PPQ (2). However, Bu-PPQ showed a more positive reduction potential (−1.58 V) compared to PPPQ (3a) (−1.90 V). The reason for the increase in reduction potential due to the tert-butyl substitution is not clear. Polymers 3a–e exhibited similar redox properties, having reduction potentials of −1.90 to −2.04 V and oxidation potentials of 0.95 to 1.09 V. BuM-PPQ and BuN-PPQ have reduction potentials that are similar to 3a–e but have more positive oxidation potentials. Polymer 3f (PTPQ) showed a reversible reduction and a quasi-reversible oxidation (Agrawal et al., 1996), indicating that PTPQ (3f) also exhibits some p-type (hole transport) semiconducting properties which may originate from its intramolecular charge transfer characteristics.

Ionization potential (IP) and electron affinity (EA) or their associated HOMO and LUMO energy levels can be estimated from the onset redox data in Table 4: IP/HOMO= $E^{ox}$+4.4 eV and EA/LUMO=$E^{red}$+4.4 eV, where the SCE energy level of −4.4 eV below the vacuum level is used (Agrawal et al., 1996). Accordingly the EA/LUMO energy level varies from 2.36 eV for PDMPQ (3e) to 2.82 eV for Bu-PPQ; and the IP/HOMO energy level varies from 5.75 eV for BuM-PPQ to 5.18 eV for Bu-PQ. If, however, an SCE energy level of −4.8 eV relative to vacuum is used as the reference as done by others (Jandke et al., 1998), the EA and IP values would increase to 2.78–3.22 eV and 5.58–6.15 eV, respectively. The reversible electrochemical reduction of all the polyquinolines and their moderately high electron affinities suggest that good electron injection and transport could be achieved in LEDs. On the other hand, hole injection and transport could likely be more difficult because of the irreversible oxidation CV and quite high ionization potentials of the polyquinolines.

Electroluminescence of the polyquinolines in single layer ITO/polyquinoline/Al type devices was either not feasible at all or the EL emission was extremely weak. Therefore we focused our study on the ITO/HTL/Polyquinoline/Al device structure where the hole-transport layer (HTL) is either TAPC:PS or PVK. The hole-transport layer was 50 nm thick and the polyquinoline layer was in the range of 30–60 nm. The polyquinolines exhibit different emission colors ranging from blue to green, yellow, orange, and red. Thus, by incorporating different linkages in the main chain or through side group substitutions, the EL emission color of the polyquinolines can be tuned. BuM-PPQ with tert-butyl and methyl substitutions emits blue light. The nonconjugated PDMPQ (3e) with bis(phenylene)methylene linkage which disrupts the backbone conjugation generates green light. Bu-PPQ with the tert-butyl group gives yellow color. PTPQ (3f) with the thiophene linkage emits red light. PPPQ (3a) and other polyquinolines including 2 and 3b–d give orange color. EL spectra of the polyquinolines were found to be identical to their PL spectra for PPQ (2). This suggests that the EL emission from these ITO/HTL/polyquinoline/Al devices come from the polyquinoline layer only and that the electroluminescence and photoluminescence of the polyquinolines originate from the same excited states which were previously identified as excimers and aggregates.

The current-voltage and luminance-voltage characteristics of PPQ and Bu-PPQ EL devices were examined. The ITO/TAPC:PS(50 nm)/PPQ(30 nm)/Al device had a turn-on voltage of 7 V, a luminance of 130 cd/m² at 17.5 V, and a current density of 235 mA/cm². The ITO/TAPC:PS(50 nm)/Bu-PPQ(50 nm)/Al device showed bright yellow color emission with luminance of 280 cd/m² at a current density of 100 mA/cm². From similar current-voltage and luminance-voltage curves, the turn-on voltages of all the polyquinoline LEDs were found to be essentially the same, 7–9 V, except PTPQ (3f) which was 5 V and BuM-PPQ and BuN-PPQ which were 10–11 V (Table 5). After normalization by the device film thickness, the turn-on electric field was the same for all the polyquinolines (~8×10⁵ V/cm) except PTPQ (5.6×10⁵ V/cm) and BuM-PPQ and BuN-PPQ (1.2×10⁶ V/cm). The higher turn-on electric field of BuM-PPQ and BuN-PPQ diodes is due largely to hole injection difficulty. This may be inferred from the fact that ITO/TAPC:PS/BuM-PPQ/Al and ITO/TAPC:PS/BuN-PPQ/Al diodes did not emit light whereas ITO/PVK/BuM-PPQ/Al and ITO/PVK/BuN-PPQ/Al diodes generated blue light. This indicates that hole injection from TAPC into these two polyquinolines was more difficult than from PVK (HOMO/LUMO=5.8/2.3 eV) (Hamaguchi and Yoshino, 1996). The lower than average turn-on electric field of PTPQ (3f) diodes is due to the ready injection of holes from TAPC (HOMO/LUMO=5.3/1.8 eV) (Lin et al., 1998) into PTPQ (HOMO/LUMO=5.27/2.56 eV). These results suggest that the 7–9 V turn-on voltages of nearly all the polyquinoline LEDs and even other device performance characteristics (luminance, EL efficiency) could be substantially improved by finding an optimum hole transport layer.

The polyquinoline EL diodes had luminance or brightness of 7 to 280 cd/m² and internal EL quantum efficiencies in the range of 0.02% for the red light-emitting PTPQ (3f) to 1.08% for Bu-PPQ (Table 5). A most remarkable feature of the EL efficiency ($\phi_{EL}$) data for the series of polyquinolines is that they approximately track the photoluminescence quantum efficiency ($\phi_{PL}$) and its variation with molecular structure. For example, except for a few cases, the ratio of $\phi_{PL}$ to $\phi_{EL}$ is on the order of 10–40 for the series of polyquinolines. Since $\phi_{EL}=f\cdot\gamma\cdot\phi_{PL}$ as pointed out earlier, these results suggest that the charge injection and transport processes as well as exciton generation from charge recombination are very similar in all the polyquinoline LEDs despite the large variation in electronic structure and particularly IP/HOMO and EA/LUMO levels. This may reasonably imply that having a series of structurally related emissive semiconducting polymers can allow one to simultaneously optimize the materials (e.g. $\phi_{PL}$) and device engineering (e.g. the product f·γ) in polymer LEDs.

Another important implication of the previously discussed similarity of the turn-on electric fields of these polyquinoline LEDs and the approximate scaling of EL efficiency data with the PL quantum yields is that variation of the EA/LUMO energy levels by ~0.5 eV among the series of polyquinolines does not appear to directly influence either the turn-on electric field or EL efficiency. Also, although there was a large barrier of ~1.5·1.9 eV to electron injection from the aluminum electrode into the polyquinolines, yet good EL efficiency, moderate luminance, and efficient electron injection were obtained. In fact the barrier to electron injection is comparable in size to that in ITO/PPV/Al single layer diodes (PPV HOMO/LUMO=5.1/2.71 eV) which have extremely poor efficiency (Cui et al., 1999; Kraft et al., 1999; Friend et al., 1999). Thus, reaction at the aluminum/polyquinoline interface dominates the electron injection process in these polyquinoline LEDs. Formation of such an aluminum/polyquinoline complex could explain all the experimental data, particularly why all the polyquinolines, regardless of their EA/LUMO levels, have efficient electron injection. Although there is no direct evidence of the Al/polyquinoline interface reaction, extensive surface spectroscopic studies of other metal/conjugated polymer interfaces suggest the generality of such reactions which are especially facilitated by the presence of electron rich atoms in the polymers (Salaneck et al., 1996). Prior studies of various heterocyclic polymers, including the polyquinolines, have established the facile coordination complexation of metal halide Lewis acids (e.g. $AlCl_3$) to the heteroatom sites (Agrawal et al., 1992; Jenekhe et al., 1990; Jenekhe et al., 1989). Similar Al atom complexation reaction starting at the imine nitrogen sites can be expected during evaporative deposition of Al onto polyquinoline thin films.

Thus, regulation of the molecular and supramolecular structures of the polyquinolines has allowed both the photoluminescence and electroluminescence colors and efficiencies to be tuned over a wide range. Emission from thin films of the polyquinolines is characterized by primarily excimers with long excited state lifetimes of 2.4 to 5.2 ns and fairly good photoluminescence quantum efficiencies of 2 to 30%. Electroluminescence diodes of the type ITO/HTL/polyquinoline/Al have quantum yields of up to 1% photons/electron and luminance levels of up to 280 cd/m$^2$. The light-emitting diodes fabricated from these emissive n-type conjugated polymers appear to be currently limited largely by hole injection and transport. The efficient electron injection from aluminum into the polyquinolines in these EL devices is proposed to be mediated by a reaction at the aluminum/polyquinoline interface which obviates the otherwise large energetic barrier to electron injection.

References

Each the references otherwise cited in this application or listed below is hereby expressly incorporated by reference in its entirety.

Abkowitz et al., Solid State Commun. 1992, 83, 937–941.
Agrawal et al., Macromolecules 1991, 24, 6806–6808.
Agrawal et al., Chem. Mater. 1992, 4, 95–104.
Agrawal et al., Macromolecules 1993(a), 26, 895–905.
Agrawal et al., Chem. Mater. 1993(b), 5, 633–640.
Agrawal et al., Chem. Mater. 1996, 8, 579–589.
Alanko, MS Thesis, University of Rochester: Rochester, N.Y., 1995.
Allen, J. Lumin. 1994, 60–61, 912–915.
Antoniadis et al., Synthetic Met. 1993, 60,149–157.
Antoniadis et al., Synth. Met. 1994(a), 62, 265–271.
Antoniadis et al., Appl. Phys. Lett. 1994(b), 65, 2030–2032.
Antoniadis et al., Mater. Res. Soc. Symp. Proc. 1994(c), 328, 377–382.
Berggren et al., Nature 1994, 372, 444–446.
Blom et al., Appl. Phys. Lett. 1996, 68, 3308–3310.
Bredas et al., J. Am. Chem. Soc. 1983, 105, 6555–6559.
Burn et al., J. Am. Chem. Soc. 1993, 115, 10117–10124.
Chen et al., Macromolecules 1996, 29, 6189–6192.
Chen et al., Macromolecules 1997(a), 30, 1728–1733.
Chen et al., Appl. Phys. Lett. 1997(b), 70, 487–489.
Chen et al., Synthetic Met. 1997(c), 85, 1431–1434.
Cui et al., Macromolecules 1999, 32, 3824–3826.
Dailey et al., J. Phys.-Condens. Matter 1998, 10, 5171–5178.
Deussen et al., Synth. Met. 1995, 73, 123–129.
Do et al., J. Appl. Phys. 1994, 76, 5118–5121.
Eckhardt et al., J. Chem. Phys. 1989,91, 1303–1315.
Eichen et al., J. Am. Chem. Soc. 1998, 120, 10463–10470.
Fou et al., J. Appl. Phys. 1996, 79, 7501–7509.
Friend et al., Nature 1999, 397, 121–128.
Fujuhira et al., Appl. Phys. Lett. 1996, 68, 1787–1789.
Gamier, Chem. Phys. 1998, 227, 253–262.
Gao, Acc. Chem. Res. 1999, 32, 247–255.
Gebler et al., Appl. Phys. Lett. 1997, 70, 1644–1646.
Gebler et al., J. Chem. Phys. 1998, 108, 7842–7848.
Greenham et al., Nature 1993, 365, 628–630.
Greenham et al., Adv. Mater. 1994, 6, 491.
Greenham et al., Chem. Phys. Lett. 1995, 241, 89–96.
Grice et al., Appl. Phys. Lett. 1998, 73, 629–631.
Gutmann et al., Organic Semiconductors; John Wiley & Sons: New York, 1967.
Gymer et al., Synth. Met. 1993, 55–57, 3683.
Halls et al., Nature 1995, 376, 498–500.
Hamaguchi et al., Appl. Phys. Lett. 1996, 69, 143–145.
Hamaguchi and Yoshino, Jpn J. Appl. Phys. 1996, 35, 4813–4818.
Hide et al., Science, 1996, 273, 1833–1836.
Hillman et al., J. Electroanal. Chem. 1990, 281, 109–124.
Ishii et al., Adv. Mater. 1999, 11, 605–625.
Jandke et al., Macromolecules 1998, 31, 6434–6443.
Jenekhe, Ind. Eng. Chem. Fundam. 1984, 23, 425–432.
Jenekhe et al., Ind. Eng. Chem. Fundam. 1984, 23, 432–436.
Jenekhe et al., Macromolecules 1989, 22, 3216–3222.
Jenekhe et al., Macromolecules 1990, 23, 4419–4429.
Jenekhe et al., Science 1994, 265, 765–768.
Jenekhe and Osaheni, Chem. Mater. 1994, 6, 1906–1909.
Jenekhe et al., Chem. Mater. 1996, 8, 2401–2404.
Jenekhe et al., Chem. Mater. 1997, 9, 409–412.
Kittel, Introduction to Solid State Physics, 6th ed.; John Wiley: New York, 1986; Chapter 19.
Kobayashi, Ed., J-Aggregates; World Scientific: Singapore, 1996.
Kraft et al., Angew. Chem. Int. Ed. 1998, 37, 402–428.
Kugler et al., Synthetic Met. 1997, 91, 143–146.
Kugler et al., Acc. Chem. Res. 1999, 32, 225–234.
Lee et al., Chem. Mater. 1996, 8, 1925–1929.
Lee et al., Chem. Mater. 1999, 11, 1083–1088.
Leising et al., Synth. Met. 1996, 81, 185–189.
Leising et al., Synth. Met. 1997, 91, 41–47.
Li et al., in Photonic and Optoelectronic Polymers, Jenekhe and Wynne, Eds. Am. Chem. Soc. Symp. Series, vol. 672, Washington D.C.: 1997.
Lin et al., J. Chem. Phys. 1996(a), 105, 8490–8494.
Lin et al., Appl. Phys. Lett. 1996(b), 69, 3495–3497.
Lin et al., Appl. Phys. Lett. 1998, 72, 864–866.

Long et al., *J. Appl. Phys.* 1996, 80, 4202–4204.
McElvain et al., *J. Appl. Phys.* 1996, 80, 6002–6007.
O'Brien et al., *Appl. Phys. Lett.* 1996, 69, 881–883.
Onitsuka et al., *J. Appl. Phys.* 1996, 80, 4067–4071.
Osaheni et al., *Chem. Mater.* 1992(a), 4, 1282–1290.
Osaheni et al., *Macromolecules* 1992(b), 25, 5828–5835.
Osaheni et al., *Macromolecules* 1993, 26, 4726–4728.
Osaheni et al., *J. Phys. Chem.* 1994(a), 98, 12727–12736.
Osaheni et al., *Appl. Phys. Lett.* 1994(b), 64, 3112–3114.
Osaheni et al., *Macromolecules* 1994(c), 27, 739–742.
Osaheni et al., *Chem. Mater.* 1995(a), 7, 672–682.
Osaheni et al., *J. Am. Chem. Soc.* 1995(b), 117, 7389–7398.
Parker, *J. Appl. Phys.* 1994, 75, 1656–1666.
Pei et al., *J. Am. Chem. Soc.* 1996, 118, 7416–7417.
Salaneck et al., *Conjugated Polymer Surfaces and Interfaces*, Cambridge University Press: Cambridge, 1996.
Samuel et al., *Phys. Rev. B* 1995, 98, 12727–12736.
Strukelj et al., *Science* 1995, 267, 1969–1972.
Tang et al., *Appl. Phys. Lett.* 1987, 51, 913–915.
Tarkka et al., *J. Am. Chem. Soc.* 1996, 118, 9438–9439.
Tasch et al., *Phys. Rev. B-Condens. Matter* 1997, 56, 4479–4483.
Tessler et al., *Nature* 1996, 382, 695–697.
Torres et al., *Chem. Mater.* 1990, 2, 306–311.
Tunney et al., *Macromolecules* 1987, 20, 258–264.
Wagaman et al., *Phil. Trans. Roy. Soc. London Ser. A* 1997, 355, 727–734.
Wang et al., *Appl. Phys. Lett.* 1997, 70, 3215–3217.
Weast et al., Eds. *Handbook of Chemistry and Physics*, 68th ed., CRC Press: Boca Raton, Fla., 1987–1988; p.E-89.
Wegmann et al., *Phys. Rev. B-Conden. Matt.* 1998, 57, R4218–R4221.
Wnek et al., *J. Polym. Sci. Polym. Lett. Ed.* 1985, 23, 609–612.
Wool, *Polymer Interfaces*; Hanser Publishers: Cincinnati, 1995.
Yamamoto et al., *J. Am. Chem. Soc.* 1996, 118, 3930–3937.
Yang et al., *Chem. Mater.* 1991, 3, 878–887.
Yang et al., *Supramolecular Sci.* 1994, 1, 91–101.
Yang et al., *Macromolecule* 1995, 28, 1180–1196.
Yu et al., *Synth. Met.* 1995, 72, 249–252.
Zhang et al., *Chem. Mater.* 1996, 8, 1571–1574.
Zhang et al., *Proc. SPIE-Int. Soc. Opt. Eng.* 1997(a), 3144, 41–52.
Zhang et al., *Proc. SPIE-Int. Soc. Opt. Eng.* 1997(b), 3148, 89–101.
Zhang et al., *Acta Polym.* 1998(a), 49, 52–55.
Zhang et al., *Mater. Res. Soc. Symp. Proc.* 1998(b), 488, 539–544.
Zhang et al., *Macromolecule* 1999, 32, 7422–7429.

Although the invention has been described in detail for the purpose of illustration, it is understood that such detail is solely for that purpose, and variations can be made therein by those skilled in the art without departing from the spirit and scope of the invention which is defined by the following claims.

What is claimed is:

1. An electroluminescent device comprising:
   an anode and a cathode capable of being electrically connected to a power supply and a voltage regulator and
   a multi-layered polymer structure, between the anode and cathode, comprising
      a first polymer layer comprising a hole transfer polymer contacting the anode; and
      a second polymer layer comprising an n-type conjugated polymer contacting the cathode,
         wherein changes in the voltage of current passing through the electroluminescent device change the color of electroluminescent emissions from the multi-layered polymer structure, the color of the electroluminescent emission being reversibly tunable to afford more than two colors.

2. The electroluminescent device according to claim 1, wherein the hole transfer polymer is a doped polymer or a p-type conjugated polymer.

3. The electroluminescent device according to claim 2, wherein the hole transfer polymer is a p-type conjugated polymer selected from the group consisting of polyphenylenes, polyphenyl alkylenes, polyfluorenes, polythiophenes, poly(vinylcarbazole), or derivatives thereof.

4. The electroluminescent device according to claim 3, wherein the p-type conjugated polymer is poly(p-phenylene vinylene).

5. The electroluminescent device according to claim 2, wherein the hole transfer polymer is a doped polymer comprising polystyrene doped with 1,1,-bis(di-4-tolylaminophenyl)cyclohexane.

6. The electroluminescent device according to claim 1, wherein the n-type conjugated polymer is selected from the group consisting of polyquinolines, polyanthazolines, polybenzobisthiazoles, polybenzimidazobenzophenanthroline ladders, polypyridines, polyphenylquinoxalines, polycyanoterephthalylidines, and derivatives thereof.

7. The electroluminescent device according to claim 6, wherein the n-type conjugated polymer is a polyquinoline selected from the group consisting of poly(2,6-(4-phenyl)quinoline), poly(2,2'-(p-phenylene)-6,6'-bis(4-phenylquinoline)), poly(2,2'-(p,p'-biphenylene)-6,6'-bis(4-phenylquinoline)), poly(2,2'-(p,p'-biphenylacetylene)-6,6'-bis(4-phenylquinoline)), poly(2,2'-(p,p'-stilbene)-6,6'-bis(4-phenylquinoline)), poly(2,2'-(4,4'-diphenylmethylene)-6,6'-bis(4-phenylquinoline)), poly(2,2'-(2,5-thienylene)-6,6'-bis(4-phenylquinoline)), and derivatives thereof.

8. The electroluminescent device according to claim 1, wherein the anode comprises indium-tin-oxide.

9. The electroluminescent device according to claim 1, wherein the cathode comprises aluminum, calcium, magnesium, or combinations thereof.

10. The electroluminescent device according to claim 1, wherein the first polymer layer is less than about 60 nm thick.

11. The electroluminescent device according to claim 10, wherein the first polymer layer is between about 25 nm to about 50 nm thick.

12. The electroluminescent device according to claim 1, wherein the second polymer layer is less than about 60 nm thick.

13. The electroluminescent device according to claim 12, wherein the first polymer layer is between about 25 nm to about 50 nm thick.

14. The electroluminescent device according to claim 1, wherein
    the first polymer layer has a thickness which is less than or equal to the hole range and
    the second polymer layer has a thickness which is less than or equal to the electron range.

15. The electroluminescent device according to claim 1, wherein IP(hole transfer polymer)–IP(n-type polymer) is greater than 0.

16. The electroluminescent device according to claim 1, wherein EA(hole transfer polymer)–EA(n-type polymer) is less than 0.

17. The electroluminescent device according to claim 16, wherein IP(hole transfer polymer)–IP(n-type polymer) is greater than 0.

18. An electroluminescent device comprising:
  an anode and a cathode capable of being electrically connected to a power supply and a voltage regulator and
  a multi-layered polymer structure, between the anode and cathode, comprising
    a first polymer layer comprising a first hole transfer polymer contacting the anode,
    a second polymer layer comprising a first n-type conjugated polymer contacting the cathode, and
    a third polymer layer positioned between the first and second polymer layers, the third polymer layer comprising a binary blend of a second hole transfer polymer and a second n-type conjugated polymer,
    wherein changes in the voltage of current passing through the electroluminescent device change the color of electroluminescent emissions from the multi-layered polymer structure.

19. The electroluminescent device according to claim 18, wherein the first and second hole transfer polymers are the same.

20. The electroluminescent device according to claim 18, wherein the first and second hole transfer polymers are different.

21. The electroluminescent device according to claim 18, wherein the first and second n-type conjugated polymers are the same.

22. The electroluminescent device according to claim 18, wherein the first and second n-type conjugated polymers are different.

23. The electroluminescent device according to claim 18, wherein
  IP(hole transfer polymer)–IP(binary blend) is greater than 0 and
  IP(binary blend)–IP(n-type polymer) is greater than 0.

24. The electroluminescent device according to claim 18, wherein
  EA(hole transfer polymer)–EA(binary blend) is less than 0 and
  EA(binary blend)–EA(n-type polymer) is less than 0.

25. The electroluminescent device according to claim 18, wherein the third polymer layer is less than about 60 nm thick.

26. The electroluminescent device according to claim 25, wherein the third polymer layer is between about 25 nm to about 50 nm thick.

27. The electroluminescent device according to claim 1, wherein the electroluminescent emission of the device is continuously tunable between first and second wavelengths.

28. The electroluminescent device according to claim 1, wherein the heterojunction between the first and second polymer layers is substantially planar.

29. A full color display comprising a plurality of pixels, each pixel comprising an electroluminescent device according to claim 1.

30. A full color display comprising a plurality of pixels, each pixel comprising an electroluminescent device according to claim 18.

* * * * *